US012804831B2

(12) United States Patent
Wu et al.

(10) Patent No.: US 12,804,831 B2
(45) Date of Patent: Nov. 17, 2026

(54) HINGE MECHANISM AND ELECTRONIC DEVICE

(71) Applicant: Huawei Technologies Co., Ltd., Shenzhen (CN)

(72) Inventors: Weifeng Wu, Dongguan (CN); Ding Zhong, Dongguan (CN); Qiang Zhan, Dongguan (CN); Leilei Hua, Shanghai (CN); Jiaxin Zhao, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 119 days.

(21) Appl. No.: 19/028,526

(22) Filed: Jan. 17, 2025

(65) Prior Publication Data

US 2025/0169002 A1 May 22, 2025

Related U.S. Application Data

(63) Continuation of application No. PCT/CN2023/119926, filed on Sep. 20, 2023.

(30) Foreign Application Priority Data

Dec. 29, 2022 (CN) ........................ 202211707094.7

(51) Int. Cl.

| | |
|---|---|
| ***H05K 5/02*** | (2006.01) |
| ***F16C 11/04*** | (2006.01) |
| *H04M 1/02* | (2006.01) |

(52) U.S. Cl.

CPC ............ *H05K 5/0226* (2013.01); *F16C 11/04* (2013.01); *H04M 1/022* (2013.01)

(58) Field of Classification Search

CPC ........ G06F 1/16; G06F 1/1616; G06F 1/1652; G06F 1/1681; G06F 1/1641; G06F 1/181; H05K 5/0226; H05K 5/0217; F16C 11/04; F16C 11/10; F16C 11/12

See application file for complete search history.

(56) References Cited

U.S. PATENT DOCUMENTS

| | | | | |
|---|---|---|---|---|
| 10,036,188 | B1 * | 7/2018 | Yao | E05D 3/122 |
| 11,336,759 | B2 * | 5/2022 | Liao | H04M 1/022 |
| 11,467,633 | B2 * | 10/2022 | Liao | G06F 1/1641 |
| 11,706,886 | B2 * | 7/2023 | Wu | G06F 1/1616 361/807 |
| 11,937,391 | B2 * | 3/2024 | Gong | H04M 1/0268 |

(Continued)

FOREIGN PATENT DOCUMENTS

| | | |
|---|---|---|
| CN | 114338864 A | 4/2022 |

*Primary Examiner* — Abhishek M Rathod

(74) *Attorney, Agent, or Firm* — Conley Rose, P.C.

(57) ABSTRACT

A hinge mechanism includes a base, a first rotation component, and a second rotation component, and the first rotation component and the second rotation component are disposed on two sides of the base respectively. The first rotation component includes a first support arm, a first rotation plate, a first pin shaft, and a first torsion spring. The first support arm is rotatably coupled to the base. A first side of the first rotation plate is rotatably coupled to the first support arm via the first pin shaft. The first torsion spring is sleeved on the first pin shaft, a first torsion arm of the first torsion spring is fastened to the first support arm, and a second torsion arm of the first torsion spring abuts against the first side of the first rotation plate.

20 Claims, 9 Drawing Sheets

(56) References Cited

U.S. PATENT DOCUMENTS

| | | | | |
|---|---|---|---|---|
| 12,332,695 | B2 * | 6/2025 | Lin | G06F 1/181 |
| 2024/0206093 | A1 * | 6/2024 | Liao | G06F 1/1681 |
| 2024/0251515 | A1 * | 7/2024 | Zhan | F16C 11/04 |
| 2024/0323269 | A1 * | 9/2024 | Lin | H04M 1/0214 |

* cited by examiner

HINGE MECHANISM AND ELECTRONIC DEVICE

CROSS-REFERENCE TO RELATED APPLICATIONS

This is a continuation of International Patent Application No. PCT/CN2023/119926 filed on Sep. 20, 2023, which claims priority to Chinese Patent Application No. 202211707094.7 filed on Dec. 29, 2022, all of which are hereby incorporated by reference in their entireties.

TECHNICAL FIELD

This disclosure relates to the field of electronic device technologies, and in particular, to a hinge mechanism and an electronic device.

BACKGROUND

With gradual maturity of flexible display technologies, a display manner of an electronic device is driven to greatly change. A foldable flexible display mobile phone, a foldable flexible display tablet computer, a wearable electronic device with a foldable flexible display, or the like is an important evolution direction of an intelligent electronic device in the future.

As a key component for implementing folding and unfolding functions of a foldable electronic device, a hinge mechanism needs to provide specific avoidance space for a flexible display in a folded state of the electronic device, to avoid pulling or squeezing the flexible display in a rotation process. This design requirement usually results in an excessively complex structure and excessively high costs of the hinge mechanism. In addition, when the electronic device is in an unfolded state, there are many mismatch gaps between components of the folding mechanism, which affects flatness of a support surface used by the folding mechanism to support the flexible display, and consequently causes delicacy problems such as a light shadow and a crease of the flexible display.

SUMMARY

This disclosure provides a hinge mechanism and an electronic device, to improve a capability of accommodating a flexible display by the hinge mechanism in a folded state and a capability of flatly supporting the flexible display in an unfolded state, thereby improving reliability of the flexible display.

According to a first aspect, this disclosure provides a hinge mechanism. The hinge mechanism may include a base and a main shaft module. The main shaft module may include a first rotation component and a second rotation component, and the first rotation component and the second rotation component are disposed on two sides of the base respectively. The base has a support surface, and a first sink step and a second sink step may be disposed on two sides of the support surface respectively. The first rotation component may include a first support arm, a first rotation plate, a first pin shaft, and a first torsion spring. The first support arm is rotatably connected to the base. A first side of the first rotation plate may be rotatably connected to the first support arm via the first pin shaft. The first torsion spring is sleeved on the first pin shaft, a first torsion arm of the first torsion spring may be fastened to the first support arm, and a second torsion arm of the first torsion spring abuts against the first side of the first rotation plate. The second rotation component may include a second support arm, a second rotation plate, a second pin shaft, and a second torsion spring. The second support arm is rotatably connected to the base. A first side of the second rotation plate may be rotatably connected to the second support arm via the second pin shaft. The second torsion spring is sleeved on the second pin shaft, a first torsion arm of the second torsion spring may be fastened to the second support arm, and a second torsion arm of the second torsion spring abuts against the first side of the second rotation plate. When the hinge mechanism is in an unfolded state, a second side of the first rotation plate is in lap joint with the first sink step, and a second side of the second rotation plate is in lap joint with the second sink step, so that flat support can be provided for a flexible display. When the hinge mechanism is in a folded state, the first rotation plate may be attached to the first support arm, and the second rotation plate may be attached to the second support arm. In this case, water-drop-like screen-accommodating space can be formed between the first rotation component, the second rotation component, and the base, thereby meeting a bending requirement of the flexible display and reducing a risk of squeezing or stretching the flexible display.

In the foregoing solution, when the hinge mechanism is switched from the unfolded state to the folded state, the first support arm and the second support arm rotate toward each other, and the first torsion spring may drive the first rotation plate to rotate relative to the first support arm, so that the second side of the first rotation plate rotates from a state of being in lap joint with the first sink step to a state of being attached to the first support arm. Correspondingly, the second torsion spring may drive the second rotation plate to rotate relative to the second support arm, so that the second side of the second rotation plate rotates from a state of being in lap joint with the second sink step to a state of being attached to the second support arm. When the hinge mechanism is switched from the folded state to the unfolded state, the first support arm and the second support arm rotate away from each other, the second side of the first rotation plate may rotate from the state of being attached to the first support arm to the state of being in lap joint with the first sink step, and drive the first torsion spring to reset. Correspondingly, the second side of the second rotation plate may rotate from the state of being attached to the second support arm to the state of being in lap joint with the second sink step, and drive the second torsion spring to reset. It can be learned that the hinge mechanism provided in this disclosure can provide reliable support for the flexible display in the unfolded state, and can also provide sufficient accommodating space for the flexible display in the folded state, so that reliability of the flexible display can be improved, and a service life of the flexible display can be prolonged.

In some possible implementation solutions, when the hinge mechanism is in the unfolded state, a surface of a side that is of the first rotation plate and that is away from the first sink step may be aligned with the support surface of the base, and a surface of a side that is of the second rotation plate and that is away from the second sink step may also be aligned with the support surface of the base, to further improve a capability of flatly supporting the flexible display by the hinge mechanism in the unfolded state.

In some possible implementation solutions, a first groove may be disposed on a side that is of the first support arm and that faces the first rotation plate, and a second groove may be disposed on a side that is of the second support arm and that faces the second rotation plate. When the hinge mechanism is in the folded state, the first rotation plate may be located in the first groove, and the second rotation plate may be located in the second groove. This helps further increase the screen-accommodating space of the hinge mechanism.

In some possible implementation solutions, a first convex lug may be disposed on the first side of the first rotation plate, the first convex lug is located on a side of the first support arm, a first through hole is disposed on the first convex lug, and the first pin shaft may be rotatably disposed in the first through hole, so that the first rotation plate is rotatably connected to the first support arm via the first pin shaft. Similarly, a second convex lug may be disposed on the first side of the second rotation plate, the second convex lug is located on a side of the second support arm, a second through hole is disposed on the second convex lug, and the second pin shaft may be rotatably disposed in the second through hole, so that the second rotation plate is rotatably connected to the second support arm via the second pin shaft.

In some possible implementation solutions, a first limiting groove may be disposed on the first convex lug, an opening of the first limiting groove is disposed away from the second side of the first rotation plate, the second torsion arm of the first torsion spring may be located in the first limiting groove, and the second torsion arm of the first torsion spring abuts against a groove bottom of the first limiting groove, so that the first torsion spring drives the first rotation plate to rotate relative to the first support arm when the first torsion spring releases energy. A second limiting groove may be disposed on the second convex lug, an opening of the second limiting groove is disposed away from the second side of the second rotation plate, the second torsion arm of the second torsion spring may be located in the second limiting groove, and the second torsion arm of the second torsion spring abuts against a groove bottom of the second limiting groove, so that the second torsion spring drives the second rotation plate to rotate relative to the second support arm when the second torsion spring releases energy.

In some possible implementation solutions, a first stopper may be disposed on a surface that is of the first convex lug and that is away from the first support arm, the first stopper has a first extension rib, the first extension rib and the first convex lug are spaced, projection of the first extension rib on a surface of the first convex lug may cover at least a part of the first through hole, and an end part of the first pin shaft is located between the first convex lug and the first extension rib, so that a risk that the first pin shaft falls off the first rotation plate and the first support arm can be reduced, and reliability of a connection between the first rotation plate and the first support arm is improved. A second stopper may be disposed on a surface that is of the second convex lug and that is away from the second support arm, the second stopper has a second extension rib, the second extension rib and the second convex lug are spaced, projection of the second extension rib on a surface of the second convex lug covers at least a part of the second channel, and an end part of the second pin shaft is located between the second convex lug and the second extension rib, so that a risk that the second pin shaft falls off the second rotation plate and the second support arm can be reduced, and reliability of a connection between the second rotation plate and the second support arm is improved.

In some possible implementation solutions, a first arc-shaped groove and a second arc-shaped groove may be disposed on the two sides of the base respectively. The first support arm includes a first arc-shaped rotation block, and the first arc-shaped rotation block may be rotatably disposed in the first arc-shaped groove, so that the first support arm is rotatably connected to the base. The second support arm includes a second arc-shaped rotation block, and the second arc-shaped rotation block may be rotatably disposed in the second arc-shaped groove, so that the second support arm is rotatably connected to the base.

In some possible implementation solutions, the first arc-shaped groove and the second arc-shaped groove may be staggered in a length direction of the hinge mechanism. In this way, a risk of interference between the first arc-shaped groove and the second arc-shaped groove in the base can be reduced, and groove opening positions inside the base can be dispersed, thereby avoiding excessively concentrated structural weak points on the base and improving structural reliability of the base.

In some possible implementation solutions, the first arc-shaped rotation block may include a first rotation sub-block and a second rotation sub-block that are spaced in the length direction of the hinge mechanism. The first arc-shaped groove may include a first arc-shaped sub-groove and a second arc-shaped sub-groove that are spaced in the length direction of the hinge mechanism, and the first arc-shaped sub-groove and the second arc-shaped sub-groove are located on two sides of the first sink step respectively. The first rotation sub-block is slidably disposed in the first arc-shaped sub-groove, and the second rotation sub-block is slidably disposed in the second arc-shaped sub-groove. Stability of motion of the first support arm relative to the base can be effectively improved through rotatable fit between the two groups of rotation sub-blocks and arc-shaped sub-grooves. The second arc-shaped rotation block may also include a third rotation sub-block and a fourth rotation sub-block that are spaced in the length direction of the hinge mechanism. The second arc-shaped groove may include a third arc-shaped sub-groove and a fourth arc-shaped sub-groove that are spaced in the length direction of the hinge mechanism, and the third arc-shaped sub-groove and the fourth arc-shaped sub-groove are located on two sides of the second sink step respectively. The third rotation sub-block is slidably disposed in the third arc-shaped sub-groove, and the fourth rotation sub-block is slidably disposed in the fourth arc-shaped sub-groove. Similarly, stability of motion of the second support arm relative to the base can be effectively improved through rotatable fit between the two groups of rotation sub-blocks and arc-shaped sub-grooves.

In some possible implementation solutions, the first support arm may further include a first fastening block connected to the first arc-shaped rotation block, the first fastening block has a first end surface, the first support arm may further include a second fastening block connected to the second arc-shaped rotation block, and the second fastening block has a first end surface. When the hinge mechanism is in the folded state, the first end surface of the first fastening block is disposed opposite to and spaced from the first end surface of the second fastening block. When the hinge mechanism is in the unfolded state, the first end surface of the first fastening block and the first end surface of the second fastening block are separately aligned with the support surface, so that the flat support can be provided for the flexible display.

In some possible implementation solutions, the first support arm may further include a first connection block, the first connection block is connected between the first support arm and the first arc-shaped rotation block, and the first groove may be disposed on the first connection block. The second support arm may further include a second connection block, the second connection block is connected between the second support arm and the second arc-shaped rotation block, and the second groove may be disposed on the second connection block.

In some possible implementation solutions, one end of the first arc-shaped rotation block in the length direction of the hinge mechanism may have a first cam surface. A first mounting hole extending in the length direction of the hinge mechanism may be disposed on the base, and the first mounting hole may be in communication with the first arc-shaped groove. The hinge mechanism may further include a first damping component mounted in the first mounting hole. The first damping component may include a first stop block, a first cam, and a first elastic member. The first stop block is fastened to the first mounting hole, the first cam is located on a side that is of the first stop block and that faces the first arc-shaped groove, the first elastic member may be limited between the first stop block and the first cam, and a side that is of the first cam and that is away from the first elastic member has a second cam surface abutting against the first cam surface. In this case, the first cam and the first arc-shaped rotation block can form a cam pair. The first damping component can be configured to provide damping force for the first rotation component and the second rotation component, so that the first rotation component and the second rotation component can rotate stably under an action of the damping force, thereby avoiding false unfolding and folding of an electronic device.

In some possible implementation solutions, the first stop block may be a screw nut, at least a part of an inner wall that is of the first mounting hole and that is close to an opening of the hole has an internal screw thread, and the first stop block may be fastened to the first mounting hole in a threaded connection manner.

In some possible implementation solutions, the hinge mechanism may further include a synchronization component. The synchronization component may include a first gear tooth disposed on an outer arc wall of the first arc-shaped rotation block, and a second gear tooth disposed on an outer arc wall of the second arc-shaped rotation block, and the first gear tooth is in transmission connection to the second gear tooth. In this way, in a process in which one support arm rotates around the base, the other support arm can be driven to synchronously rotate in a direction toward or away from the one support arm.

In some possible implementation solutions, the synchronization component may further include a first rack, a second rack, and a synchronization gear, and the first rack and the second rack are spaced in the length direction of the hinge mechanism. The first rack and the second rack are separately slidably disposed on the base, the first rack is meshed with the first gear tooth, the second rack is meshed with the second gear tooth, the synchronization gear is located between the first rack and the second rack, and the synchronization gear is separately meshed with the first rack and the second rack. In this way, the first rack and the second rack can synchronously slide toward or away from each other via the synchronization gear, so that the first arc-shaped rotation block meshed with the first rack and the second arc-shaped rotation block meshed with the second rack can synchronously rotate toward or away from each other.

In some possible implementation solutions, a first opening groove and a second opening groove may be disposed on a side that is of the base and that is away from the support surface. The first opening groove is in communication with the first arc-shaped groove, the first gear tooth is located in an area in which the first arc-shaped rotation block is exposed to the first opening groove, and the first rack is slidably disposed in the first opening groove, so that the first gear tooth is meshed with the first rack. The second opening groove is in communication with the second arc-shaped groove, the second gear tooth is located in an area in which the second arc-shaped rotation block is exposed to the second opening groove, and the second rack is slidably disposed in the second opening groove, so that the second gear tooth is meshed with the second rack.

In some possible implementation solutions, the hinge mechanism may further include an end cover, and the end cover may be disposed on the side that is of the base and that is away from the support surface. A surface of a side that is of the end cover and that is away from the base can be formed as an outer surface of the hinge mechanism, that is, the hinge mechanism forms a surface of an appearance surface of the electronic device, thereby helping improve appearance quality of the electronic device.

According to a second aspect, this disclosure further provides an electronic device. The electronic device may include a first housing, a second housing, a flexible display, and the hinge mechanism according to any possible implementation solution of the first aspect. The first housing and the second housing are separately disposed on two sides of the hinge mechanism, the first housing is fastened to the first support arm, and the second housing is fastened to the second support arm. The flexible display may continuously cover the first housing, the second housing, and the hinge mechanism, and the flexible display is separately fastened to the first housing and the second housing. The hinge mechanism of the electronic device can provide flat support for the flexible display of the electronic device in an unfolded state, and provide sufficient accommodating space for the flexible display of the electronic device in a folded state, so that reliability of the flexible display is improved, and overall reliability of the electronic device can be further improved.

Figure 1:
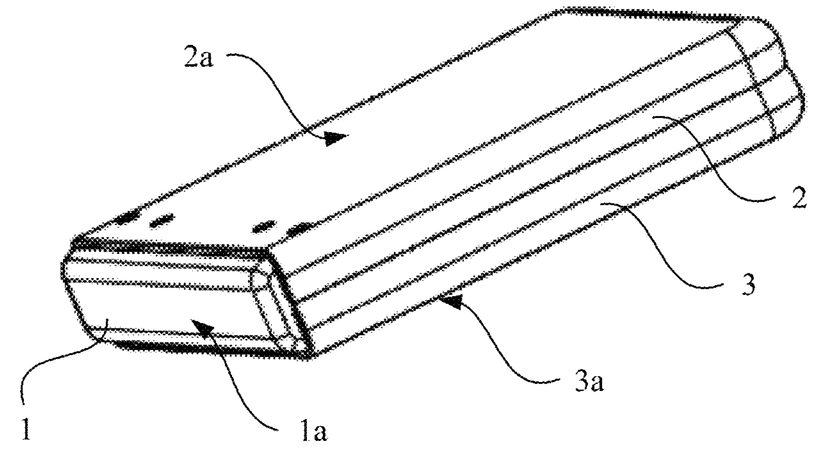
FIG. 1 is a diagram of a structure of an electronic device according to an embodiment of this disclosure.

Reference numerals: 1: hinge mechanism; 1*a*: appearance surface of a hinge mechanism; 1*b*: support surface of a hinge mechanism and support surface of a base; 11: main shaft module; 11*a*: first rotation component; 111: first support arm; 1111: first arc-shaped rotation block; 1111*a*: first rotation sub-block; 1111*b*: second rotation sub-block; 11111: first cam surface; 1112: first fastening block; 1112*a*: first end surface of a first fastening block; 1112*b*: second end surface of a first fastening block; 11121: first hinged hole; 11122: first extension block; 111221: first clamping groove; 1113: first connection block; 1114: first groove; 112: first rotation plate; 112*a*: first side of a first rotation plate; 112*b*: second side of a first rotation plate; 1121: first convex lug; 11211: first through hole; 11212: first stopper; 112121: first extension rib; 11213: first limiting groove; 113: first pin shaft; 114: first torsion spring; 1141: first torsion arm of a first torsion spring; 1142: second torsion arm of a first torsion spring; 11*b*: second rotation component; 115: second support arm; 1151: second arc-shaped rotation block; 1151*a*: third rotation sub-block; 1151*b*: fourth rotation sub-block; 1152: second fastening block; 1153: second connection block; 1154: second groove; 116: second rotation plate; 1161: second convex lug; 117: second pin shaft; 118: second torsion spring; 1181: first torsion arm of a second torsion spring; 1182: second torsion arm of a second torsion spring; 12: base; 121: first arc-shaped groove; 121*a*: first arc-shaped sub-groove; 121*b*: second arc-shaped sub-groove; 122: first sink step; 123: second arc-shaped groove; 123*a*: third arc-shaped sub-groove; 123*b*: fourth arc-shaped sub-groove; 124: second sink step; 125: first mounting hole; 126: first opening groove; 127: second opening groove; 13: end cover; 14*a*: first damping component; 14*b*: second damping component; 141: first stop block; 142: first cam; 1421: second cam surface; 143: first elastic member; 144: first guiding pillar; 15: synchronization component; 151: first gear tooth; 152: second gear tooth; 153: first rack; 154: second rack; 155: synchronization gear; 2: first housing; 2*a*: appearance surface of a first housing; 2*b*: support surface of a first housing; 201: first mounting groove; 3: second housing; 3*a*: appearance surface of a second housing; 3*b*: support surface of a second housing; 301: second mounting groove; and 4: flexible display.

DESCRIPTION OF EMBODIMENTS

To make objectives, technical solutions, and advantages of this disclosure clearer, the following further describes embodiments of this disclosure in detail with reference to accompanying drawings. However, example implementations may be implemented in a plurality of forms, and should not be construed as being limited to implementations described herein. Same reference numerals in the accompanying drawings indicate same or similar structures, and therefore repeated descriptions thereof are omitted. Words for expressing positions and directions in embodiments of this disclosure are described by using the accompanying drawings as examples. However, changes may be made as required, and all changes shall fall within the protection scope of this disclosure. The accompanying drawings in embodiments of this disclosure are merely used to show a relative position relationship and do not indicate a true scale.

It should be noted that specific details are described in the following descriptions for ease of understanding this disclosure. However, embodiments of this disclosure can be implemented in a plurality of other manners different from those described herein, and a person skilled in the art can make similar promotion without violating a connotation of embodiments of this disclosure. Therefore, this disclosure is not limited to the following disclosed specific implementations.

FIG. 1 is a diagram of a structure of an electronic device according to an embodiment of this disclosure. The electronic device may be a mobile phone, a personal digital assistant (PDA), a notebook computer, a tablet computer, or another device having a foldable function. The electronic device in the embodiment shown in FIG. 1 is described by using the mobile phone as an example. The electronic device may include a hinge mechanism, a flexible display, and two housings. For ease of description, the two housings may be respectively named a first housing 2 and a second housing 3. The first housing 2 and the second housing 3 are located on two sides of the hinge mechanism 1, and may rotate around the hinge mechanism 1. When the electronic device is used, the electronic device may be folded and unfolded in different use scenarios. The electronic device provided in embodiments of this disclosure may be an inwardly folded electronic device. In the embodiment shown in FIG. 1, the electronic device is in a folded state, and FIG. 1 shows a relative position relationship between the hinge mechanism 1 and the two housings when the electronic device is in the folded state. In this case, an appearance surface 1*a* of the hinge mechanism 1, a first appearance surface 2*a* of the first housing 2, and a second appearance surface 3*a* of the second housing 3 may be jointly used as an appearance surface of the electronic device. The appearance surface 1*a* of the hinge mechanism 1 is a surface that is of the hinge mechanism 1 and that is away from the flexible display, the first appearance surface 2*a* of the first housing 2 is a surface that is of the first housing 2 and that is away from the flexible display, and the second appearance surface 3*a* of the second housing 3 is a surface that is of the second housing 3 and that is away from the flexible display.

Figure 2:
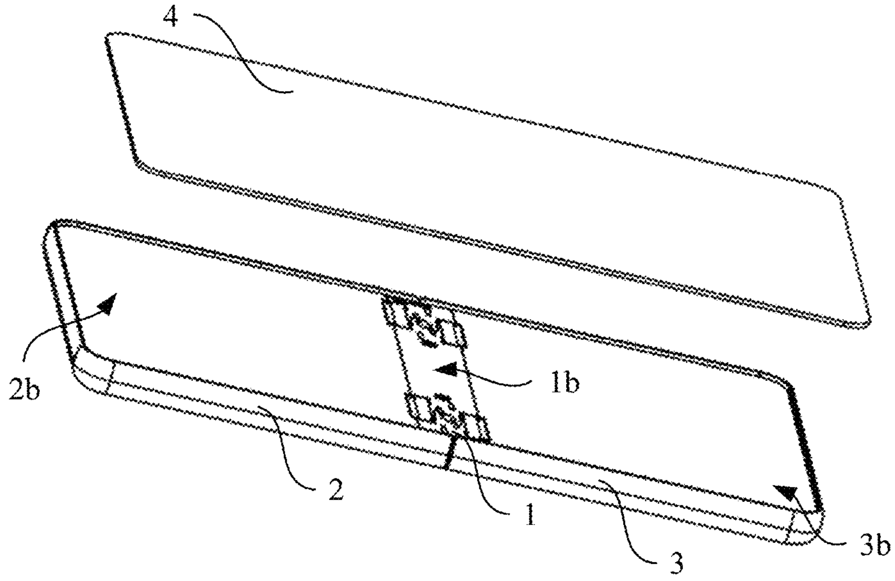
FIG. 2 is a diagram of a structure of the electronic device shown in FIG. 1 in an unfolded state.

FIG. 2 is a diagram of a structure of the electronic device shown in FIG. 1 in an unfolded state. It should be noted that FIG. 2 shows structures of a support surface 1*b* of the hinge mechanism 1, a support surface 2*b* of the first housing 2, and a support surface 3*b* of the second housing 3. The support surface 1*b* of the hinge mechanism 1 is a surface that is of the hinge mechanism 1 and that is used to support the flexible display 4, the support surface 2*b* of the first housing 2 is a surface that is of the first housing 2 and that is used to support the flexible display 4, and the support surface 3*b* of the second housing 3 is a surface that is of the second housing 3 and that is used to support the flexible display 4. The flexible display 4 may continuously cover the support surface 2*b* of the first housing 2, the support surface 1*b* of the hinge mechanism 1, and the support surface 3*b* of the second housing 3. The flexible display 4 may be fastened to the support surface 2*b* of the first housing 2 and the support surface 3*b* of the second housing 3, and a connection manner thereof may be but is not limited to bonding. In this way, when the electronic device is in the unfolded state shown in FIG. 2, the hinge mechanism 1, the first housing 2, and the second housing 3 can support the flexible display 4.

In a process in which the first housing 2 and the second housing 3 rotate relative to each other from the unfolded state shown in FIG. 2 to the folded state shown in FIG. 1, or from the folded state shown in FIG. 1 to the unfolded state shown in FIG. 2, the flexible display 4 may be folded or unfolded with the first housing 2 and the second housing 3.

Figure 3:
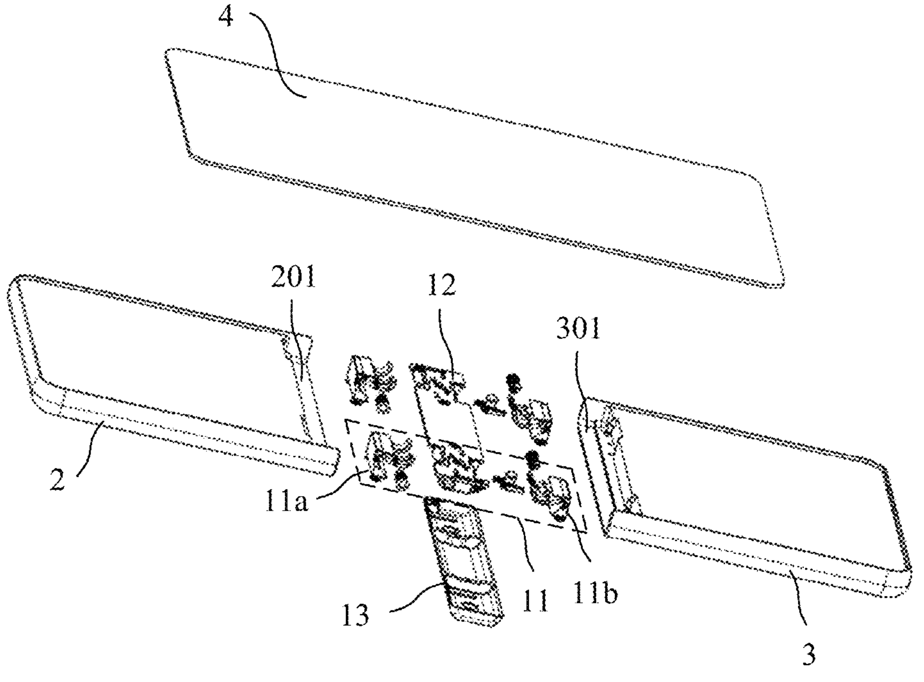
FIG. 3 is a diagram of a partially exploded structure of the electronic device shown in FIG. 2.

FIG. 3 is a diagram of a partially exploded structure of the electronic device shown in FIG. 2. In this embodiment of this disclosure, the first housing 2 and the second housing 3 may be located on two opposite sides of the hinge mechanism 1. A side that is of the first housing 2 and that is close to the hinge mechanism 1 has a first mounting groove 201, a side that is of the second housing 3 and that is close to the hinge mechanism 1 has a second mounting groove 301, one side of the hinge mechanism 1 may be partially accommodated in the first mounting groove 201, and the other side of the hinge mechanism 1 may be partially accommodated in the second mounting groove 301. The hinge mechanism 1 may include one main shaft module 11, or may include a plurality of main shaft modules 11. FIG. 3 shows a case in which the hinge mechanism 1 includes two main shaft modules 11, and the two main shaft modules 11 may be spaced in a length direction of the hinge mechanism 1. The length direction of the hinge mechanism 1 may be understood as an extension direction of an axis around which the first housing 2 and the second housing 3 rotate around the hinge mechanism 1. The first housing 2 and the second housing 3 may be rotatably connected via the plurality of main shaft modules 11. This can effectively improve stability of rotation of the first housing 2 and the second housing 3 of the electronic device relative to the hinge mechanism 1.

Still refer to FIG. 3. In this embodiment, the main shaft module 11 may include two rotation components, and the two rotation components are a first rotation component 11*a* and a second rotation component 11*b* respectively. The hinge mechanism 1 may further include a base 12. The base 12 may be used as a bearing component of the first rotation component 11*a* and the second rotation component 11*b*, and the first rotation component 11*a* and the second rotation component 11*b* are disposed on two sides of the base 12 respectively. In this case, a surface of a side of the base 12 may be used as the support surface 1*b* of the hinge mechanism 1, to support the flexible display. In addition, the hinge mechanism 1 may further include an end cover 13, and the end cover 13 may cover a side that is of the base 12 and that is away from the support surface, to form accommodating space between the end cover 13 and the base 12. It is easy to understand that a surface of a side that is of the end cover 13 and that is away from the base 12 is an outer surface of the hinge mechanism 1, that is, a surface that is of the hinge mechanism 1 and that forms the appearance surface of the electronic device.

For ease of description, in the following embodiments of this disclosure, the main shaft module 11 is described mainly by using a specific manner of disposing the first rotation component 11*a* and a connection relationship between the first rotation component 11*a* and the base 12 as an example, and the second rotation component 11*b* side may be disposed with reference to the first rotation component 11*a* side. It should be noted that, a design of the second rotation component 11*b* may be completely the same as that of the first rotation component 11*a*, or reference may be made to only components and connection relationships included in the first rotation component 11*a*, and other parameters may be adaptively adjusted, and are not required to be completely the same.

It should be noted that, in a possible embodiment of this disclosure, when there is a plurality of main shaft modules 11, the first rotation component 11*a* and the second rotation component 11*b* of the plurality of main shaft modules 11 may all use a same base 12 as the bearing component, to improve an integration degree of the hinge mechanism 1. In some other possible embodiments of this disclosure, one base 12 corresponding to each main shaft module 11 may be disposed in the hinge mechanism 1, so that the first rotation component 11*a* and the second rotation component 11*b* of each main shaft module 11 use the corresponding base 12 as the bearing component.

Figure 4:
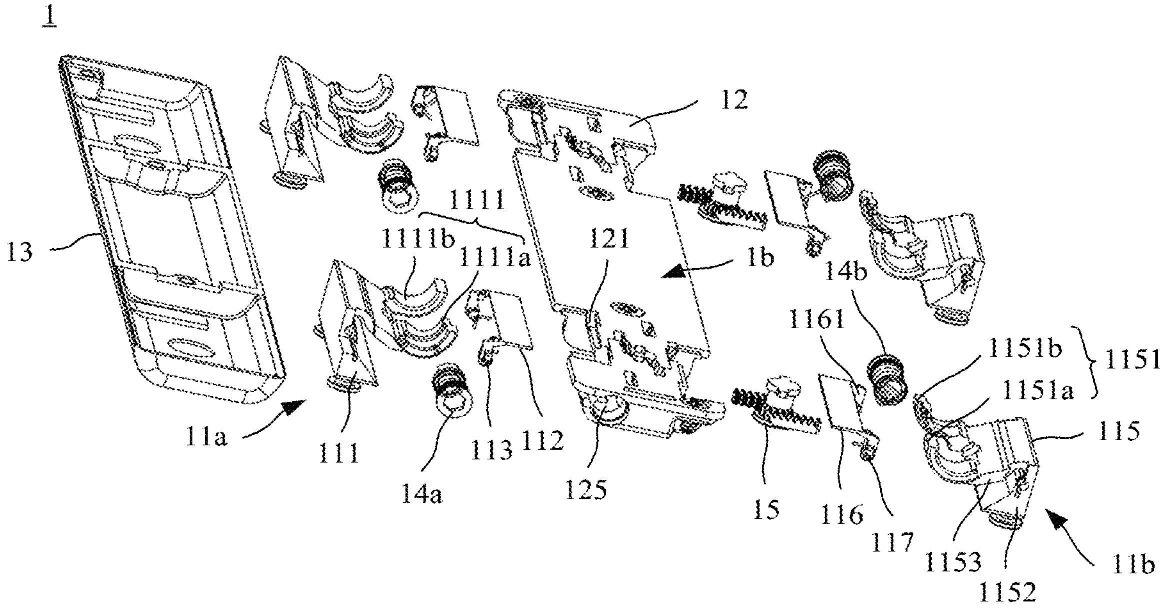
FIG. 4 is a diagram of an exploded structure of a hinge mechanism according to an embodiment of this disclosure.

FIG. 4 is a diagram of an exploded structure of the hinge mechanism 1 according to an embodiment of this disclosure. In this embodiment of this disclosure, the first rotation component 11*a* may include a first support arm 111, the first support arm 111 is rotatably connected to the base 12, and a rotation axis center of the first support arm 111 is disposed in the length direction of the hinge mechanism 1. In addition, the first support arm 111 may further be fastened to the first housing, so that when the first support arm 111 rotates relative to the base 12, the first housing can be driven to synchronously rotate, thereby implementing switching between the folded state and the unfolded state of the electronic device.

Figure 5:
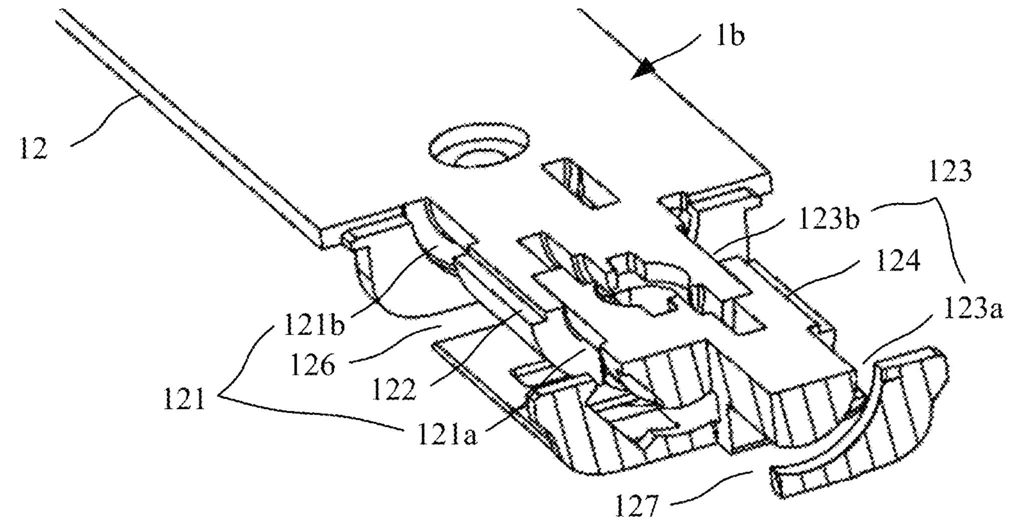
FIG. 5 is a diagram of a sectional structure of a base according to an embodiment of this disclosure.
Figure 6:
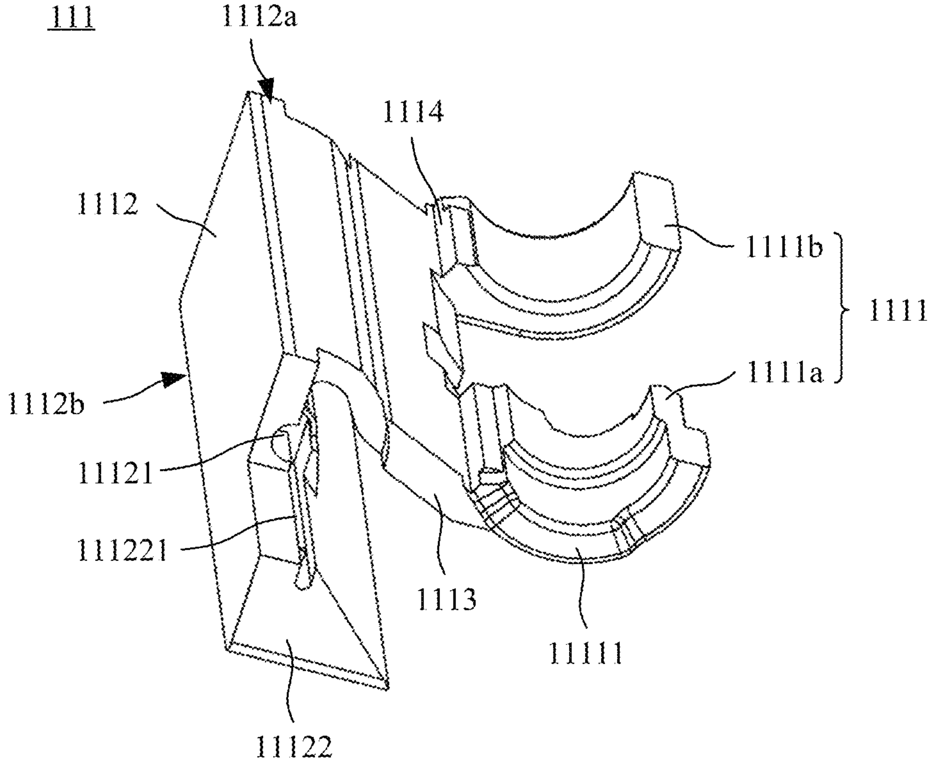
FIG. 6 is a diagram of a structure of a first support arm according to an embodiment of this disclosure.

Refer to FIG. 5 and FIG. 6 together. FIG. 5 is a diagram of a sectional structure of the base 12 according to an embodiment of this disclosure, and FIG. 6 is a diagram of a structure of the first support arm 111 according to an embodiment of this disclosure. In this embodiment, a first arc-shaped rotation block 1111 may be disposed at one end that is of the first support arm 111 and that is connected to the base 12. Correspondingly, a first arc-shaped groove 121 may be disposed on the base 12. The first arc-shaped rotation block 1111 of the first support arm 111 may be accommodated in the first arc-shaped groove 121, and may rotate along an arc-shaped surface of the first arc-shaped groove 121, so that the first support arm 111 rotates around the base 12. Such a manner in which the arc-shaped groove fits the arc-shaped rotation block to implement rotation around an axis center determined by a virtual position may be referred to as a rotatable connection manner of a virtual shaft. In other words, the two rotation entities do not directly rotate relative to each other via a physical pin shaft, but implement the rotatable connection via the foregoing fit structure. This connection manner helps reduce space occupied by the first support arm 111 on the base 12, thereby helping reduce a volume of the main shaft module and facilitating a miniaturization design of the hinge mechanism 1. The first arc-shaped rotation block 1111 may be but is not limited to a circular-arc-shaped rotation block, and the first arc-shaped groove 121 may be but is not limited to a circular-arc-shaped groove.

In a specific embodiment, the first arc-shaped rotation block 1111 may include two rotation sub-blocks, which are respectively a first rotation sub-block 1111*a* and a second rotation sub-block 1111*b*. The first rotation sub-block 1111*a* and the second rotation sub-block 1111*b* may be spaced in the length direction of the hinge mechanism. Correspondingly, the first arc-shaped groove 121 may also include a first arc-shaped sub-groove 121*a* and a second arc-shaped sub-groove 121*b*, and the first arc-shaped sub-groove 121*a* and the second arc-shaped sub-groove 121*b* may also be spaced in the length direction of the hinge mechanism. The first rotation sub-block 1111*a* may be accommodated in the first arc-shaped sub-groove 121*a*, and may rotate along an arc-shaped surface of the first arc-shaped sub-groove 121*a*. The second rotation sub-block 1111*b* may be accommodated in the second arc-shaped sub-groove 121*b*, and may rotate along an arc-shaped surface of the second arc-shaped sub-groove 121*b*. Stability of motion of the first support arm 111 relative to the base 12 can be effectively improved through rotatable fit between the two groups of rotation sub-blocks and arc-shaped sub-grooves.

Certainly, in some other embodiments, the first support arm 111 and the base 12 may alternatively be rotatably connected via a physical shaft. In this case, a hinged hole may be separately disposed on the first support arm 111 and the base 12, and the physical shaft is rotatably disposed in the hinged holes of the first support arm 111 and the base 12.

In some embodiments, the first support arm 111 may further include a first fastening block 1112 and a first connection block 1113. The first fastening block 1112 is located at an end that is of the first support arm 111 and that is away from the base 12, and the first connection block 1113 is located between the first fastening block 1112 and the first arc-shaped rotation block 1111, to connect the first fastening block 1112 to the first arc-shaped rotation block 1111. In a specific implementation, the first fastening block 1112 is located in the first mounting groove 201 (refer to FIG. 3) of the first housing 2, and the first fastening block 1112 has a first end surface 1112*a* and a second end surface 1112*b* that are disposed away from each other. When the electronic device is in the unfolded state, the first end surface 1112*a* of the first fastening block 1112 may be aligned with the support surface 1*a* of the base 12, to provide flat support for the flexible display. The second end surface 1112*b* of the first fastening block 1112 is fastened to the first housing 2. For example, a threaded hole is disposed on the second end surface 1112*b* of the first fastening block 1112, and the first fastening block 1112 may be fastened to the first housing 2 via a fastener.

Figure 7:
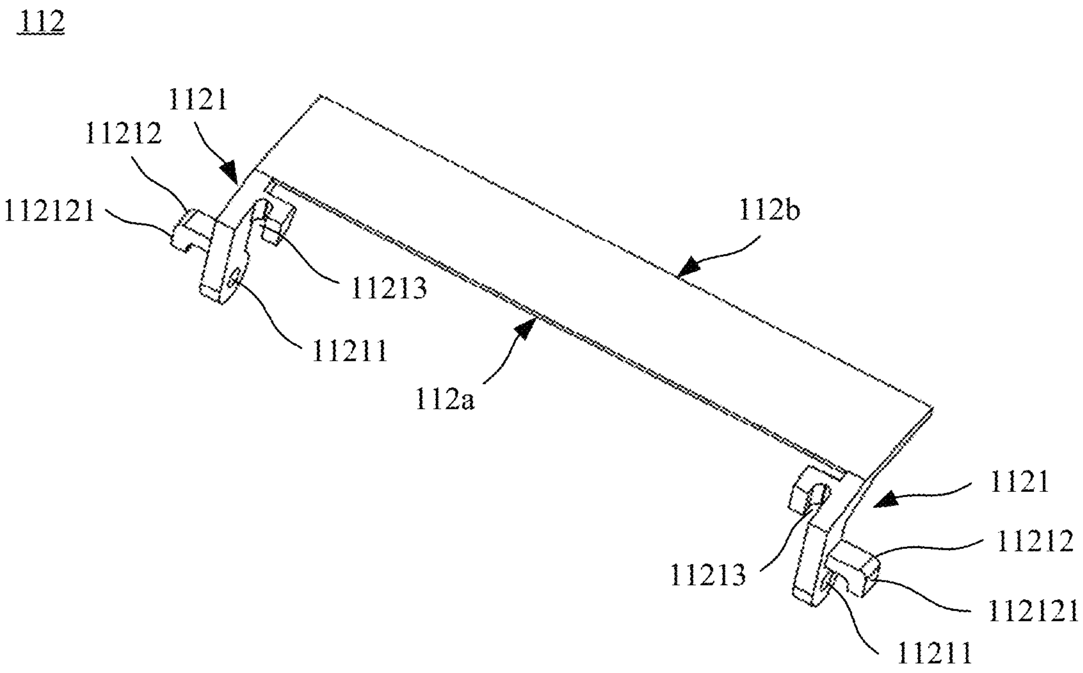
FIG. 7 is a diagram of a structure of a first rotation plate according to an embodiment of this disclosure.

Still refer to FIG. 4. The first rotation component 11*a* may further include a first rotation plate 112, and the first rotation plate 112 is rotatably connected to the first support arm 111. For example, the first rotation plate 112 may be rotatably connected to the first support arm 111 via a first pin shaft 113. Refer to FIG. 6 and FIG. 7 together. FIG. 7 is a diagram of a structure of the first rotation plate 112 according to an embodiment of this disclosure. The first rotation plate 112 includes a first side 112*a* and a second side 112*b* that are disposed opposite to each other. A first convex lug 1121 may be disposed on the first side 112*a* of the first rotation plate 112. The first convex lug 1121 may be located on one side of the first fastening block 1112, and a first through hole 11211 is disposed on the first convex lug 1121. A first hinged hole 11121 is disposed on a side surface of the first fastening block 1112, and the first pin shaft 113 is separately rotatably disposed in the first through hole 11211 and the first hinged hole 11121, so that the first rotation plate 112 is rotatably connected to the first support arm 111. In some implementations, the first hinged hole 11121 may be a blind hole. In this case, one end of the first pin shaft 113 is located on a side that is of the first convex lug 1121 and that is away from the first fastening block 1112, and the other end is located in the first hinged hole 11121. In some other implementations, the first hinged hole 11121 may be a through hole. In this case, one end of the first pin shaft 113 is located on a side that is of the first convex lug 1121 and that is away from the first fastening block 1112, and the other end extends from the other side of the first fastening block 1112.

In some embodiments, there may be two first convex lugs 1121, and the two first convex lugs 1121 may be spaced in the length direction of the hinge mechanism. When the first rotation plate 112 is rotatably connected to the first support arm 111, the two first convex lugs 1121 may be located on the two sides of the first fastening block 1112 respectively, and are separately rotatably connected to the first fastening block 1112 via the first pin shaft 113, so that reliability of a connection between the first rotation plate 112 and the first support arm 111 can be improved, and stability of rotation of the first rotation plate 112 can be further improved. It should be noted that, when the first hinged hole 11121 is the blind hole, the first convex lugs 1121 on the two sides may be separately hinged to the first fastening block 1112 via one first pin shaft 113. When the first hinged hole 11121 is the through hole, the first convex lugs 1121 on the two sides may share one first pin shaft 113 to implement hinging to the first fastening block 1112.

In addition, a first stopper 11212 may be disposed on a surface that is of the first convex lug 1121 and that is away from the first support arm 111. The first stopper 11212 has a first extension rib 112121. The first extension rib 112121 and the first convex lug 1121 are spaced, and may be approximately parallel to each other. Projection of the first extension rib 112121 on a surface of the first convex lug 1121 may cover at least a part of the first through hole 11211. In this way, after the first pin shaft 113 is mounted on the first rotation plate 112, the first extension rib 112121 can stop and be disposed at an end part of the first pin shaft 113, so that a risk that the first pin shaft 113 falls off the first rotation plate 112 and the first support arm 111 can be reduced, and the reliability of the connection between the first rotation plate 112 and the first support arm 111 is improved.

Refer to FIG. 4, FIG. 6, and FIG. 7 together. In this embodiment of this disclosure, the first rotation component 11*a* may further include a first torsion spring 114, and the first torsion spring 114 may be sleeved on the first pin shaft 113. A position of disposing the first torsion spring 114 on the first pin shaft 113 is not limited. For example, the first torsion spring 114 may be sleeved on a part that is of the first pin shaft 113 and that is located between the first convex lug 1121 of the first rotation plate 112 and the first fastening block 1112, so that the first convex lug 1121 and the first fastening block 1112 are used to limit axial (namely, the length direction of the hinge mechanism) movement of the first torsion spring 114.

Figure 8A:
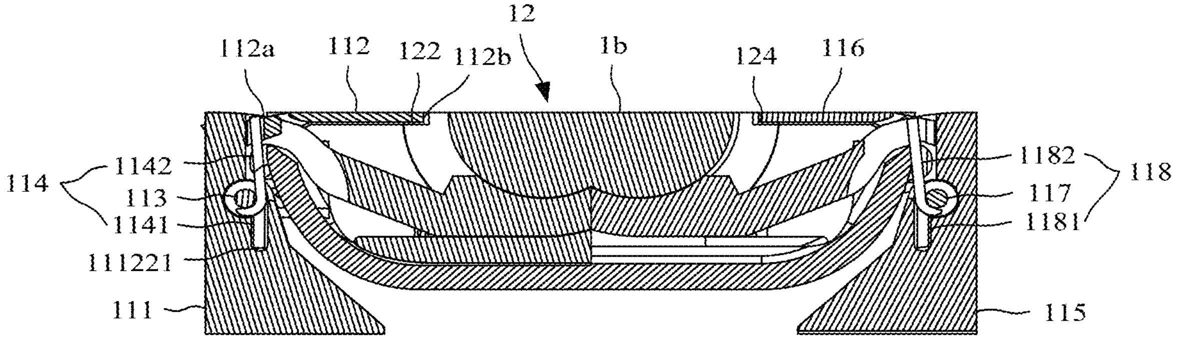
FIG. 8A is a diagram of a sectional structure of a hinge mechanism in an unfolded state according to an embodiment of this disclosure.
Figure 8B:
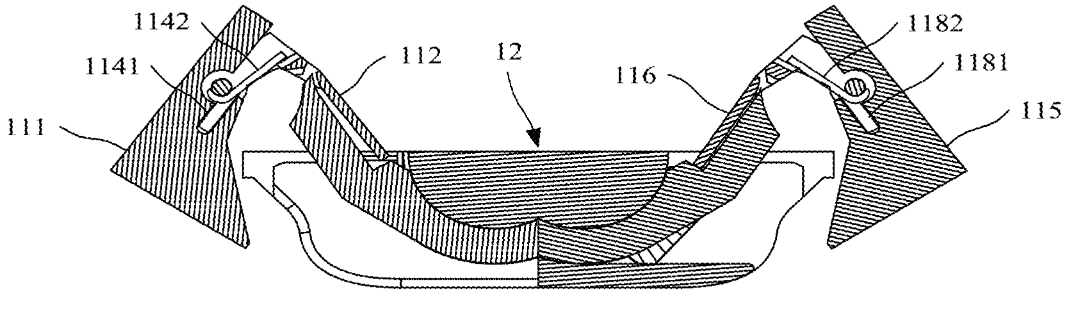
FIG. 8B is a diagram of a sectional structure of a hinge mechanism in an intermediate state according to an embodiment of this disclosure.
Figure 8C:
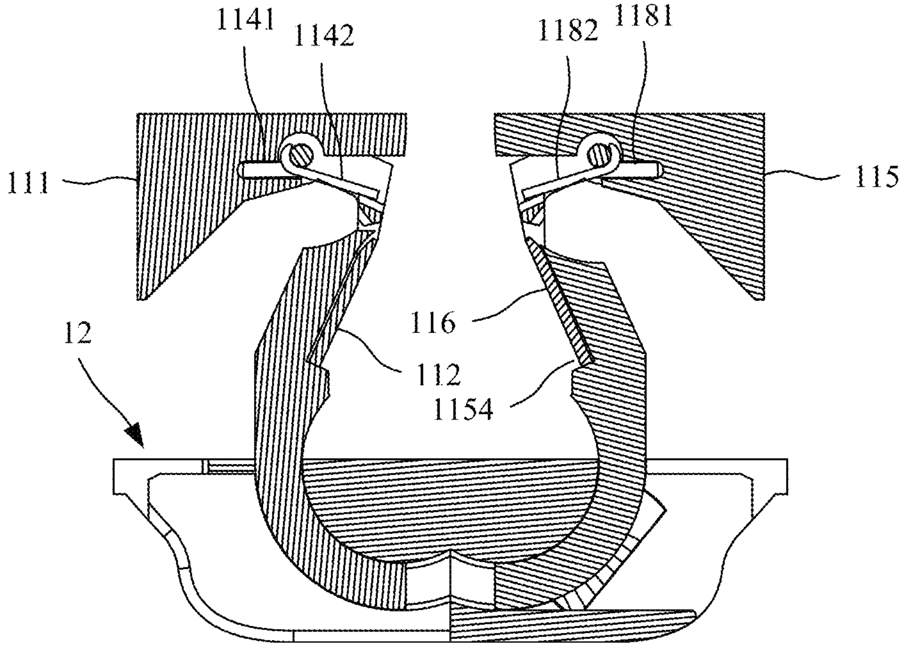
FIG. 8C is a diagram of a sectional structure of a hinge mechanism in a folded state according to an embodiment of this disclosure.

Refer to FIG. 8A to FIG. 8C together. FIG. 8A, FIG. 8B, and FIG. 8C are diagrams of sectional structures of the hinge mechanism in different states. Two ends of the first torsion spring 114 have a first torsion arm 1141 and a second torsion arm 1142 respectively. The first torsion arm 1141 of the first torsion spring 114 may be fastened to the first support arm 111, and the second torsion arm 1142 of the first torsion spring 114 may abut against the first side 112*a* of the first rotation plate 112. Refer to FIG. 6 and FIG. 7 together. In the length direction of the hinge mechanism 1, a first extension block 11122 disposed beyond the first arc-shaped rotation block 1111 is disposed on a side of the first fastening block 1112, the first extension block 11122 may be disposed close to the second end surface 1112*b* of the first fastening block 1112, a first clamping groove 111221 is disposed on a side that is of the first extension block 11122 and that faces the first end surface 1112*a* of the first fastening block 1112, and the first torsion arm 1141 of the first torsion spring 114 may be disposed in the first clamping groove 111221. A first limiting groove 11213 is disposed on the first convex lug 1121, an opening of the first limiting groove 11213 is disposed away from the second side 112*b* of the first rotation plate 112, the second torsion arm 1142 of the first torsion spring 114 may be located in the first limiting groove 11213, and the second torsion arm 1142 of the first torsion spring 114 abuts against a groove bottom of the first limiting groove 11213.

In some embodiments, a first sink step 122 may be disposed on a side that is of the support surface 1*b* of the base 12 and that is close to the first rotation component 11*a* (refer to the base 12 shown in FIG. 5 together), and the sink step may be understood as a step whose step surface is lower than the support surface 1*b* of the base 12. When the hinge mechanism 1 is in the unfolded state, the second side 112*b* of the first rotation plate 112 may be in lap joint with the first sink step 122, and in a specific design, a thickness of the first rotation plate 112 may be approximately the same as a height of the first sink step 122. In this way, in the unfolded state, a surface of a side that is of the first rotation plate 112 and that is away from the first sink step 122 can be aligned with the support surface 1*b* of the base 12, to provide the flat support for the flexible display.

In this embodiment of this disclosure, the first torsion spring 114 may be designed to be in a retracted state when the hinge mechanism 1 is in the unfolded state. In this case, the first rotation plate 112 has a trend of rotating clockwise and attaching to the first support arm 111 under an abutting action of the second torsion arm 1142 of the first torsion spring 114. However, because the first sink step 122 limits the first rotation plate 112, the rotation trend of the first rotation plate 112 is slowed down. In a process in which the first support arm 111 rotates relative to the base 12 and switches the hinge mechanism 1 to the folded state, the first rotation plate 112 is gradually free from limiting effect of the first sink step 122. When the first rotation plate 112 is completely free from limiting of the first sink step 122, the first rotation plate 112 may quickly rotate toward a direction of the first support arm 111 under the abutting action of the second torsion arm 1142 of the first torsion spring 114 until the first rotation plate 112 is attached to the first support arm 111. In this case, the hinge mechanism 1 is also switched to the folded state with rotation of the first support arm 111, and water-drop-like screen-accommodating space is formed. Based on a design in which the first rotation plate 112 may be attached to the first support arm 111, when the hinge mechanism 1 is in the folded state, the first rotation plate 112 does not occupy the screen-accommodating space, thereby helping increase an available volume of the screen-accommodating space and meeting a bending requirement of the flexible display.

In addition, when the hinge mechanism 1 is in the folded state, the first torsion spring 114 may still be in a partially retracted state, that is, in this case, the first torsion spring 114 may still apply specific abutting force to the first rotation plate 112, so that the first rotation plate 112 can be firmly attached to the first support arm 111, and the screen-accommodating space of the hinge mechanism 1 in the folded state is always in a consistent form, thereby avoiding squeezing the flexible display in a falling process of the entire electronic device, and improving reliability of the flexible display.

In some embodiments, a first groove 1114 may be disposed on a side that is of the first support arm 111 and that faces the first rotation plate 112 (refer to the first support arm shown in FIG. 6 together). When the hinge mechanism is in the folded state, the first rotation plate 112 may be located in the first groove 1114, and the first rotation plate 112 is attached to a bottom wall of the first groove 1114. This helps further increase the available volume of the screen-accommodating space.

In a specific implementation, the first groove 1114 may be further disposed on the first connection block 1113. In this case, one end of the first connection block 1113 may be connected to an end that is of the first fastening block 1112 and that is close to the first end surface 1112*a*, and the first end surface 1112*a* of the first fastening block 1112 and a corresponding side surface of the first connection block 1113 form smooth transition at a joint. The other end of the first connection block 1113 is connected to an outer arc wall of the first arc-shaped rotation block 1111. In this way, a mismatch gap can be formed between an inner arc wall of the first connection block 1113 and the first arc-shaped rotation block 1111, and the first connection block 1113 and the first arc-shaped rotation block 1111 may form the first groove 1114 by using the mismatch gap.

As described above, the second rotation component 11*b* and the first rotation component 11*a* may be disposed on the two sides of the base 12 respectively. During specific implementation, refer to FIG. 4 and FIG. 5 again. The second rotation component 11*b* may also include a second support arm 115, a second rotation plate 116, a second pin shaft 117, and a second torsion spring 118. A second arc-shaped rotation block 1151 may be disposed at an end that is of the second support arm 115 and that is configured to connect to the base 12, a second arc-shaped groove 123 may be disposed on the base 12, and the second arc-shaped rotation block 1151 is slidably disposed in the second arc-shaped groove 123. In some possible implementations, the second arc-shaped groove 123 and the first arc-shaped groove 121 may be staggered in the length direction of the hinge mechanism 1. In this way, sufficient rotation space can be provided for the first arc-shaped rotation block 1111 and the second arc-shaped rotation block 1151 by increasing depths of the first arc-shaped groove 121 and the second arc-shaped groove 123, a risk of interference between the first arc-shaped groove 121 and the second arc-shaped groove 123 in the base 12 can be reduced, and groove opening positions in the base 12 can be dispersed, thereby avoiding excessively concentrated structural weak points on the base 12.

In addition, to improve stability of motion of the second support arm 115, the second arc-shaped rotation block 1151 may include a third rotation sub-block 1151*a* and a fourth rotation sub-block 1151*b* that are disposed in the length direction of the hinge mechanism 1. Correspondingly, the second arc-shaped groove 123 may also include a third arc-shaped sub-groove 123*a* and a fourth arc-shaped sub-groove 123*b*. The third rotation sub-block 1151*a* is rotatably disposed in the third arc-shaped sub-groove 123*a*, and the fourth rotation sub-block 1151*b* is rotatably disposed in the fourth arc-shaped sub-groove 123*b*.

The second support arm 115 may further include a second fastening block 1152 and a second connection block 1153. The second fastening block 1152 is located at an end that is of the second support arm 115 and that is away from the base 12, and the second connection block 1153 is connected between the second fastening block 1152 and the second arc-shaped rotation block 1151. In a specific implementation, the second fastening block 1152 is located in the second mounting groove 301 (refer to FIG. 3) of the second housing 3, and the second fastening block 1152 may have a first end surface and a second end surface that are disposed away from each other. When the electronic device is in the unfolded state, the first end surface of the second fastening block 1152 may be aligned with the support surface of the base 12, to provide the flat support for the flexible display. The second end surface of the second fastening block 1152 is fastened to the second housing 3.

Refer to FIG. 4 again. A first side of the second rotation plate 116 may be rotatably connected to the second support arm 115 via the second pin shaft. A second convex lug 1161 may be disposed on the first side of the second rotation plate 116, and a second through hole is disposed on the second convex lug 1161. A hinged hole is disposed on a side surface of the second fastening block 1152, and the second pin shaft 117 is separately rotatably disposed in the second through hole and the hinged hole. Similarly, there may be two second convex lugs 1161, and the two second convex lugs 1161 may be spaced in the length direction of the hinge mechanism 1. When the second rotation plate 116 is rotatably connected to the second support arm 115, the two second convex lugs 1161 may be located on two sides of the second fastening block 1152 respectively, and are separately rotatably connected to the second fastening block 1152 via the second pin shaft 117.

In addition, a second stopper may be disposed on a surface that is of the second convex lug 1161 and that is away from the second support arm 115, the second stopper has a second extension rib, the second extension rib and the second convex lug 1161 are spaced, and projection of the second extension rib on a surface of the second convex lug 1161 may cover at least a part of the second through hole. After the second pin shaft 117 is mounted on the second rotation plate 116, the second extension rib can stop and be disposed at an end part of the second pin shaft 117, so that a risk that the second pin shaft 117 falls off the second rotation plate 116 and the second support arm 115 can be reduced.

Refer to FIG. 8A to FIG. 8C. The second torsion spring 118 may be sleeved on the second pin shaft 117. Two ends of the second torsion spring 118 have a first torsion arm 1181 and a second torsion arm 1182 respectively. The first torsion arm 1181 of the second torsion spring 118 may be fastened to the second support arm 115, and the second torsion arm 1182 of the second torsion spring 118 may abut against the first side of the second rotation plate 116. In a specific implementation, a second limiting groove may be disposed on the second convex lug, an opening of the second limiting groove is disposed away from a second side of the second rotation plate 116, and the second torsion arm 1182 of the second torsion spring 118 may be located in the second limiting groove.

In some embodiments, a second sink step 124 may be disposed on a side that is of the support surface 1*b* of the base 12 and that is close to the second rotation component 11*b*. When the hinge mechanism 1 is in the unfolded state, the second side of the second rotation plate 116 may be in lap joint with the second sink step 124, and a surface of a side that is of the second rotation plate 116 and that is away from the second sink step 124 may be aligned with the support surface 1*b* of the base 12, to provide the flat support for the flexible display.

Similarly, the second torsion spring 118 may also be designed to be in the retracted state when the hinge mechanism 1 is in the unfolded state. In the process in which the second support arm 115 rotates relative to the base 12 and switches the hinge mechanism 1 to the folded state, the second rotation plate 116 is gradually free from limiting effect of the second sink step 124. When the second rotation plate 116 is completely free from limiting of the second sink step 124, the second rotation plate 116 may quickly rotate toward a direction of the second support arm 115 under the abutting action of the second torsion arm 1182 of the second torsion spring 118 until the second rotation plate 116 is attached to the second support arm 115. In this case, the hinge mechanism 1 is also switched to the folded state with rotation of the second support arm 115, and the water-drop-like screen-accommodating space is formed. In addition, when the hinge mechanism 1 is in the folded state, the second torsion spring 118 may still be in a partially retracted state, so that the second rotation plate 116 can be firmly attached to the second support arm 115 under the action of the second torsion arm 1182 of the second torsion spring 118.

In some embodiments, a second groove 1154 may be disposed on a side that is of the second support arm 115 and that faces the second rotation plate 116. When the hinge mechanism 1 is in the folded state, the second rotation plate 116 may be located in the second groove 1154, to further increase the available volume of the screen-accommodating space.

After the connection relationship between the first rotation component 11*a* and the base 12 and the connection relationship between the second rotation component 11*b* and the base 12 that are provided in the foregoing embodiments of this disclosure are understood, the following describes a motion process of the hinge mechanism 1.

Figure 9A:
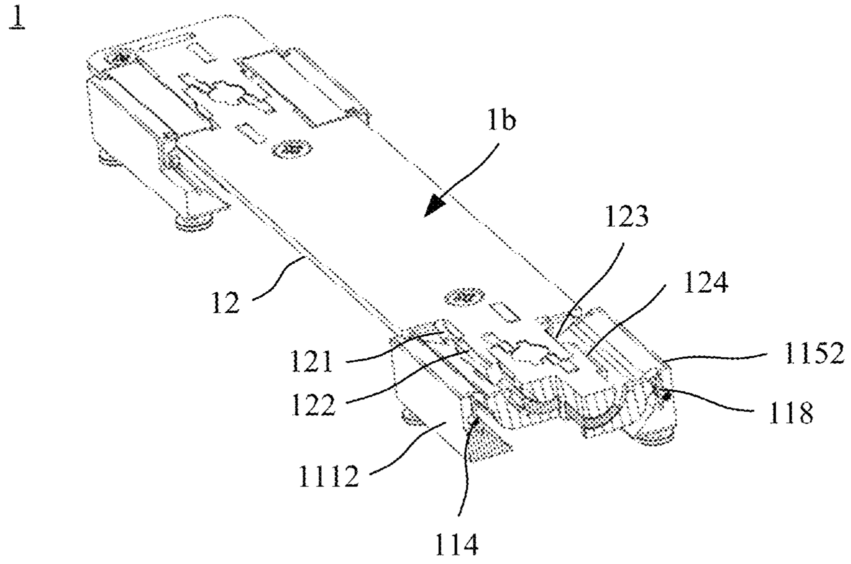
FIG. 9A is a diagram of a structure of a hinge mechanism in an unfolded state according to an embodiment of this disclosure.
Figure 9B:
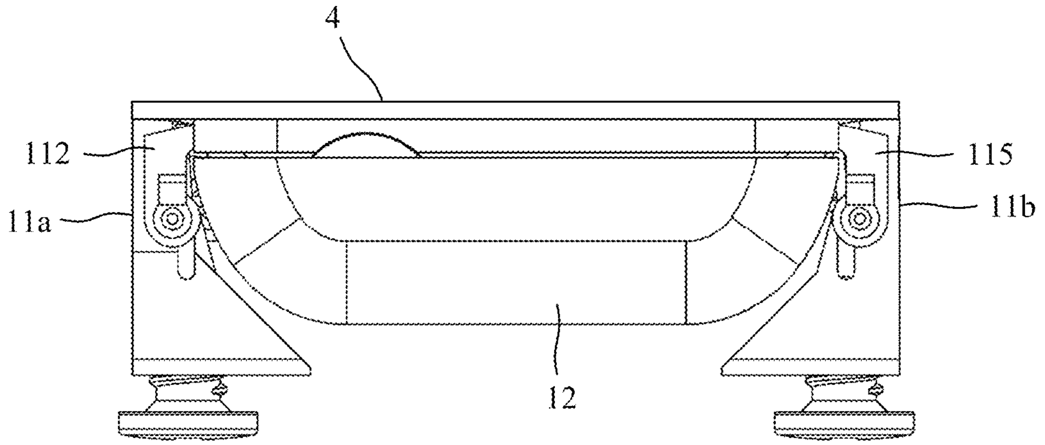
FIG. 9B is a diagram of an assembly structure of a hinge mechanism in an unfolded state and a flexible display according to an embodiment of this disclosure.

First, refer to FIG. 9A and FIG. 9B. FIG. 9A is a diagram of a structure of the hinge mechanism 1 in the unfolded state according to an embodiment of this disclosure, and FIG. 9B is a diagram of an assembly structure of the hinge mechanism 1 in the unfolded state and the flexible display 4 according to an embodiment of this disclosure. It should be noted that the first rotation plate 112 and the second rotation plate 116 are omitted in FIG. 9A. When the hinge mechanism 1 is in the unfolded state, the first torsion spring 114 and the second torsion spring 118 are both in the retracted state, the first rotation plate 112 is in lap joint with the first sink step 122, the second rotation plate 116 is in lap joint with the second sink step 124, the first end surface of the first fastening block 1112 and the surface of the side that is of the first rotation plate 112 and that is away from the first sink step 122 are separately aligned with the support surface 1*b* of the base 12, and the first end surface of the second fastening block 1152 and the surface of the side that is of the second rotation plate 116 and that is away from the second sink step 124 are also separately aligned with the support surface 1*b* of the base 12. In other words, a highest end surface of the first rotation component 11*a* and a highest end surface of the second rotation component 11*b* are both aligned with the support surface 1*b* of the base 12, and there is almost no mismatch gap on the surface of the support surface side of the hinge mechanism 1, thereby greatly improving flatness of an area of the hinge mechanism 1 of the entire electronic device and providing the flat support for the flexible display 4.

Figure 10:
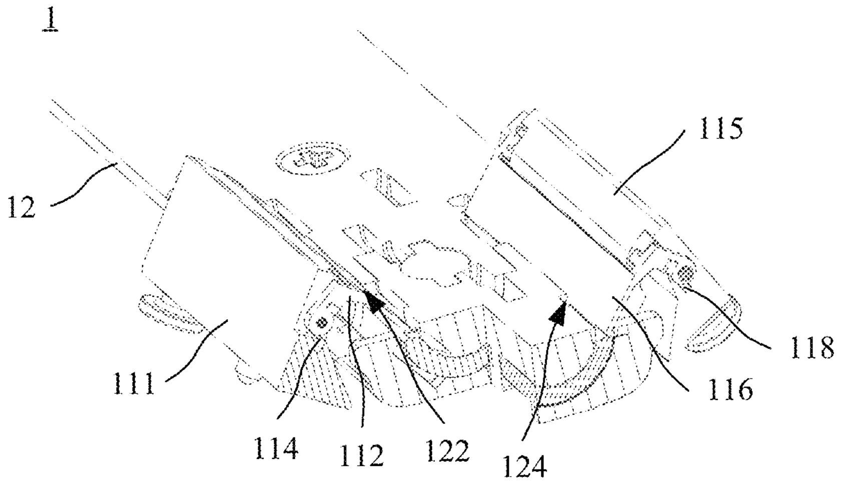
FIG. 10 is a diagram of a structure of a hinge mechanism in an intermediate state according to an embodiment of this disclosure.

FIG. 10 is a diagram of a structure of the hinge mechanism 1 in an intermediate state according to an embodiment of this disclosure. In the process in which the hinge mechanism 1 is switched from the unfolded state to the folded state, at an initial stage, due to the limiting effect of the first sink step 122, the first torsion spring 114 releases accumulated elastic potential energy slowly, the first rotation plate 112 may rotate slightly relative to the first support arm 111 under the action of the first torsion spring 114, and the second side of the first rotation plate 112 gradually moves toward an edge of the first sink step 122 until the first support arm 111 rotates to a specific angle. In this case, the first rotation plate 112 may be free from the limiting of the first sink step 122. Similarly, due to the limiting effect of the second sink step 124, the second rotation plate 116 also rotates slightly relative to the second support arm 115 under the action of the second torsion spring 118, and the second side of the second rotation plate 116 gradually moves toward an edge of the second sink step 124 until the second support arm 115 rotates to a specific angle. In this case, the second rotation plate 116 may be free from the limiting of the second sink step 124.

Figure 11A:
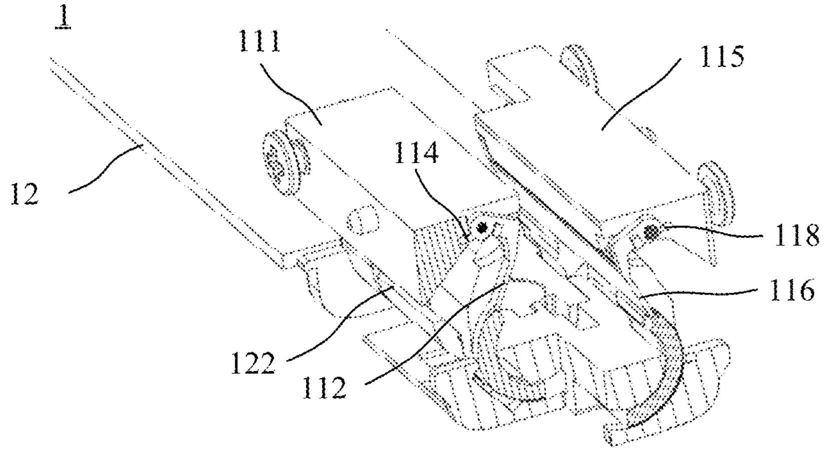
FIG. 11A is a diagram of a structure of a hinge mechanism in a folded state according to an embodiment of this disclosure.
Figure 11B:
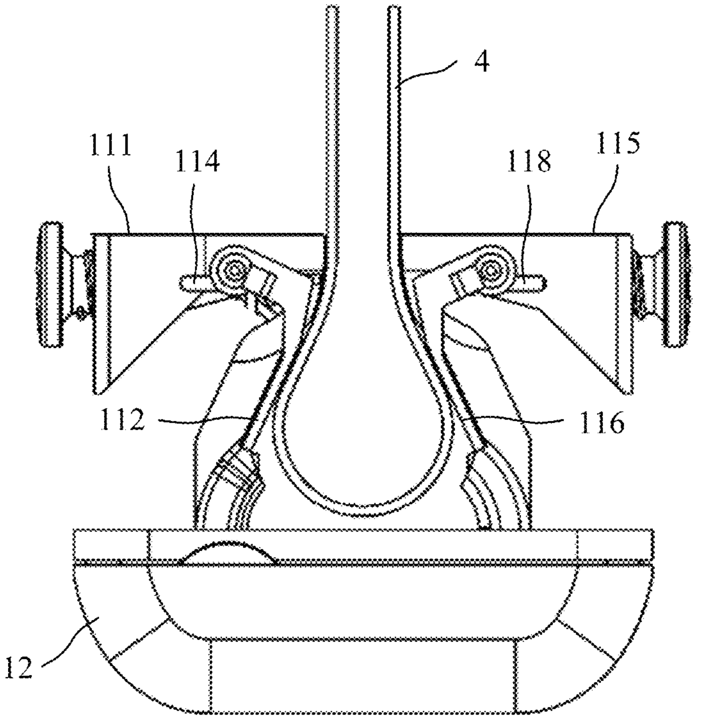
FIG. 11B is a diagram of an assembly structure of a hinge mechanism in a folded state and a flexible display according to an embodiment of this disclosure.

Refer to FIG. 11A and FIG. 11B. FIG. 11A is a diagram of a structure of the hinge mechanism 1 in the folded state according to an embodiment of this disclosure, and FIG. 11B is a diagram of an assembly structure of the hinge mechanism 1 in the folded state and the flexible display 4 according to an embodiment of this disclosure. As the first support arm 111 further rotates, the first rotation plate 112 is gradually free from the limiting of the first sink step 122, and then the first torsion spring 114 may quickly release the elastic potential energy, and push the first rotation plate 112 to rotate in the direction of the first support arm 111 until the first rotation plate 112 is attached to the first support arm 111. Similarly, as the second support arm 115 further rotates, after the second rotation plate 116 is free from the limiting of the second sink step, the second torsion spring 118 may push the second rotation plate 116 to quickly rotate in the direction of the second support arm 115 until the second rotation plate 116 is attached to the second support arm 115. After the hinge mechanism 1 is switched to the folded state, the water-drop-like screen-accommodating space may be formed between the first rotation component 11*a*, the second rotation component 11*b*, and the base 12, thereby meeting the bending requirement of the flexible display 4 of the electronic device, reducing a risk of squeezing or stretching the flexible display 4, and prolonging a service life of the flexible display 4.

Refer to FIG. 4 again. In this embodiment of this disclosure, to better unfold and fold the hinge mechanism 1, a damping component that can provide damping force for the first rotation component 11*a* and the second rotation component 11*b* may be further disposed on the hinge mechanism 1, so that the first rotation component 11*a* and the second rotation component 11*b* can rotate stably under the action of the damping force, thereby avoiding false unfolding and folding of the electronic device and implementing suspension of the two housings in specified positions. The hinge mechanism 1 may include one damping component. In this case, the damping component may be disposed corresponding to the first rotation component 11*a* or the second rotation component 11*b* of one main shaft module. Alternatively, the hinge mechanism 1 may include a plurality of damping components. In this case, the plurality of damping components may be disposed corresponding to the first rotation component 11*a* and the second rotation component 11*b* in at least one main shaft module. For example, FIG. 4 shows a case in which the hinge mechanism 1 includes four damping components. The four damping components may be disposed corresponding to the first rotation components 11*a* and the second rotation components 11*b* in the two main shaft modules respectively. For ease of differentiation, the damping component disposed corresponding to the first rotation component 11*a* is referred to as a first damping component 14*a*, and the damping component disposed corresponding to the second rotation component 11*b* is referred to as a second damping component 14*b*. The following mainly uses a manner of disposing the first damping component 14*a* and a connection relationship between the first damping component 14*a* and the first rotation component 11*a* as an example for description. The second damping component 14*b* may be disposed with reference to the first damping component 14*a*.

In this embodiment of this disclosure, a first mounting hole 125 extending in the length direction of the hinge mechanism 1 may be disposed on the base 12. The first mounting hole 125 may be in communication with the first arc-shaped groove 121 configured to accommodate the first arc-shaped rotation block 1111. The first damping component 14*a* may be mounted in the first mounting hole 125. An end that is of the first arc-shaped rotation block 1111 and that faces the first mounting hole 125 may have a first cam surface 11111 (refer to the first support arm 111 shown in FIG. 6). Herein, the cam surface may be understood as a surface formed by a curved contour on the first arc-shaped rotation block 1111.

Figure 12:
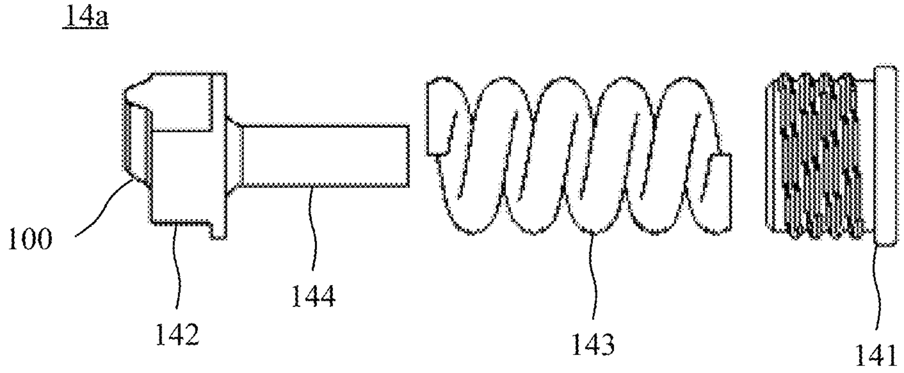
FIG. 12 is a diagram of an exploded structure of a first damping component according to an embodiment of this disclosure.

FIG. 12 is a diagram of an exploded structure of the first damping component 14*a* according to an embodiment of this disclosure. The first damping component 14*a* may include a first stop block 141, a first cam 142, and a first elastic member 143. The first stop block 141 may be fastened to the first mounting hole 125. The first cam 142 is located on a side that is of the first stop block 141 and that faces the first arc-shaped groove 121, the first cam 142 may slide in the first mounting hole 125, and a side that is of the first cam 142 and that is away from the first stop block 141 has a second cam surface 1421. The first elastic member 143 may be limited between the first stop block 141 and the first cam 142.

In some implementations, the first stop block 141 may be a screw nut shown in FIG. 12, at least a part of an inner wall that is of the first mounting hole 125 and that is close to an opening of the hole has an internal screw thread, and the first stop block 141 may be fastened to the first mounting hole 125 in a threaded connection manner. In some other implementations, the first stop block 141 may alternatively be fastened to the first mounting hole 125 in an interference fit manner.

In some implementations, the first elastic member 143 may be a spring shown in FIG. 12. In this case, the first damping component 14*a* may further include a first guiding pillar 144 located between the first stop block 141 and the first cam 142, and the first elastic member 143 may be sleeved over the first guiding pillar 144, to avoid displacement of the first elastic member 143 when elastic deformation occurs. For example, the first guiding pillar 144 and the first cam 142 may be of an integrated structure, to simplify an assembly process of the first damping component 14*a* on the hinge mechanism 1. In some other implementations, the first elastic member 143 may alternatively be a spring plate, there may be a plurality of spring plates, and the plurality of spring plates is stacked between the first stop block 141 and the first cam 142.

Figure 13:
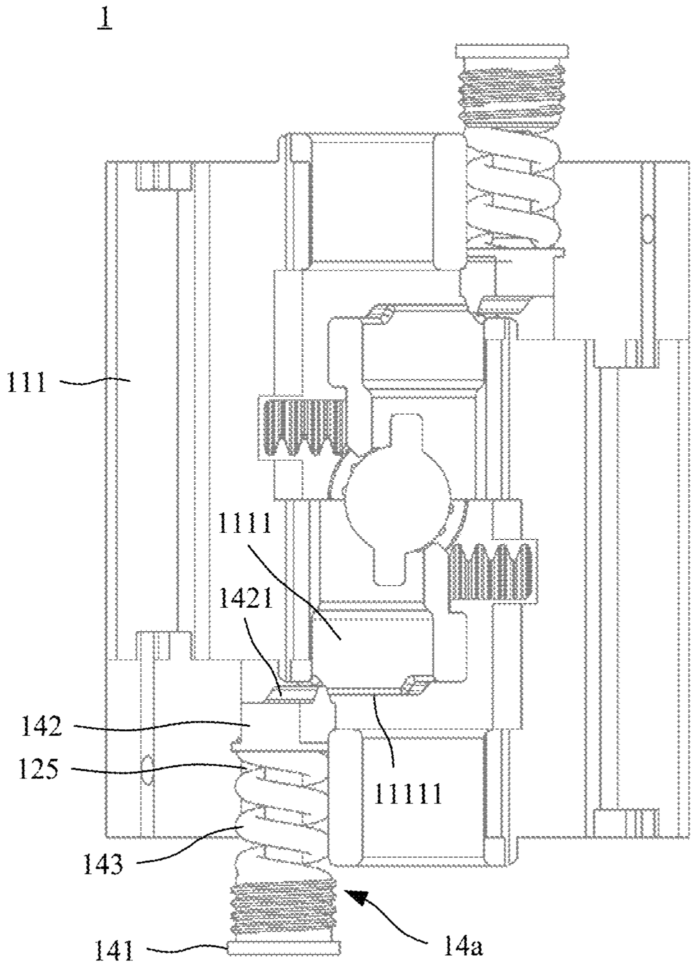
FIG. 13 is a diagram of a partial structure of a hinge mechanism according to an embodiment of this disclosure.

FIG. 13 is a diagram of a partial structure of the hinge mechanism 1 according to an embodiment of this disclosure. Refer to FIG. 12 and FIG. 13 together. When the first damping component 14*a* is mounted in the first mounting hole 125, the first elastic member 143 is gradually compressed as the first stop block 141 is screwed into the first mounting hole 125. Under an action of the first elastic member 143, the second cam surface 1421 of the first cam 142 may abut against the first cam surface 11111 of the first arc-shaped rotation block 1111. In this case, the first cam 142 and the first arc-shaped rotation block 1111 may form a cam pair. In this embodiment, curved surface contours of the first cam surface 11111 and the second cam surface 1421 are properly designed, so that in the process in which the hinge mechanism 1 is folded, the first arc-shaped rotation block 1111 can push the first cam 142 toward a direction close to the first stop block 141, thereby compressing the first elastic member 143. In this way, a user obtains an obvious tactile feeling of performing an operation. This helps improve user experience. In the process in which the hinge mechanism 1 is unfolded, the first elastic member 143 gradually rebounds from a compressed state, and releases accumulated elastic potential energy, to push the first cam 142 to slide in a direction away from the first stop block 141. In this way, the first cam 142 can apply torque force to the first arc-shaped rotation block 1111 to facilitate rotation of the first arc-shaped rotation block 1111, thereby providing specific unfolding assistance for the hinge mechanism 1 and further reducing unfolding operation difficulty of the hinge mechanism 1.

In addition, in this embodiment of this disclosure, the first cam surface 11111 and the second cam surface 1421 are properly designed, so that the first arc-shaped rotation block 1111 can be suspended at a specified angle, that is, the first support arm 111 is suspended. When the hinge mechanism 1 is used in the electronic device, the electronic device may be positioned in some intermediate states by using a suspendable design of the first support arm 111, thereby further improving user experience.

Figure 14:
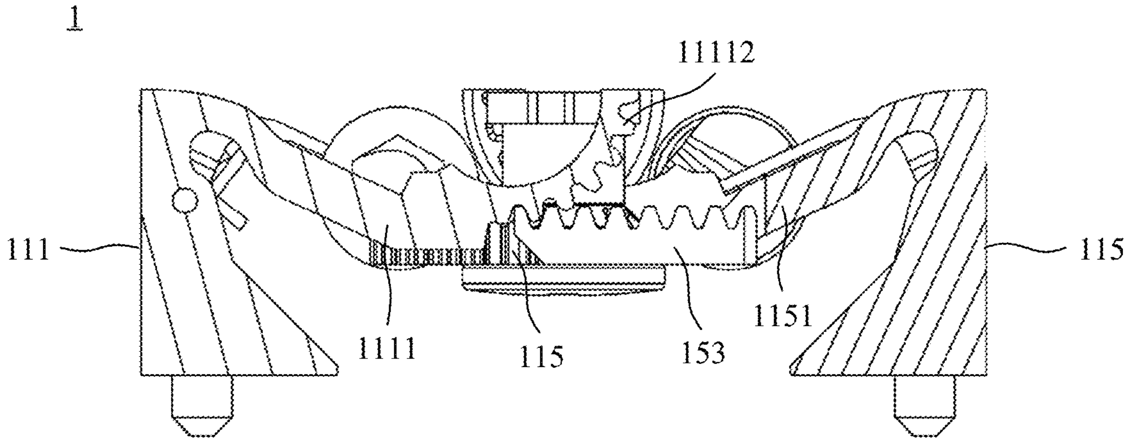
FIG. 14 is a diagram of a partially sectional structure of a hinge mechanism according to an embodiment of this disclosure.

In addition to the foregoing structures, in some embodiments of this disclosure, another possible structure may be further disposed in the hinge mechanism 1. FIG. 14 is a diagram of a partially sectional structure of the hinge mechanism 1 according to an embodiment of this disclosure. In this embodiment, the hinge mechanism 1 may further include a synchronization component 15. The synchronization component 15 may include a first gear tooth 151 disposed on the outer arc wall of the first arc-shaped rotation block 1111, and a second gear tooth disposed on an outer arc wall of the second arc-shaped rotation block 1151. The first gear tooth 151 is in transmission connection to the second gear tooth. In this way, in a process in which one support arm rotates around the base, the other support arm can be driven to synchronously rotate in a direction toward or away from to the one support arm, and rotation angles of the two support arms are consistent. In this way, in a process in which the two support arms synchronously rotate, the first housing and the second housing of the electronic device can be driven to synchronously rotate, so that instantaneous force can be avoided from being applied to the flexible display fastened to the two housings, thereby improving the reliability of the flexible display.

Figure 15:
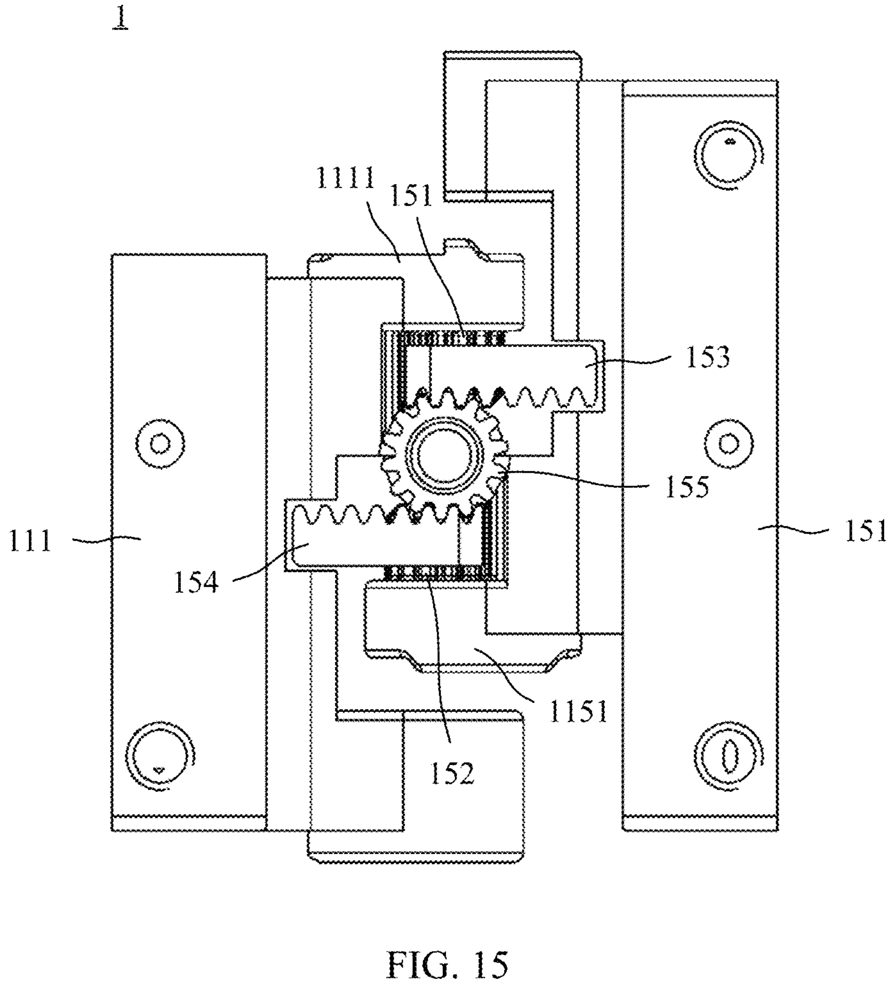
FIG. 15 is a diagram of a partial structure of a side that is of a hinge mechanism and that is away from a support surface of the hinge mechanism according to an embodiment of this disclosure.

FIG. 15 is a diagram of a partial structure of a side that is of the hinge mechanism 1 and that is away from the support surface of the hinge mechanism 1 according to an embodiment of this disclosure. In this embodiment of this disclosure, the synchronization component 15 may further include a first rack 153, a second rack 154, and a synchronization gear 155. The first rack 153 and the second rack 154 may be spaced in the length direction of the hinge mechanism 1, and the first rack 153 and the second rack 154 may be slidably disposed on the base in a width direction of the base. The first rack 153 is meshed with the first gear tooth 151 on the first arc-shaped rotation block 1111, the second rack 154 is meshed with the second gear tooth 152 on the second arc-shaped rotation block 1151, the synchronization gear 155 is located between the first rack 153 and the second rack 154, and the synchronization gear 155 is separately meshed with the first rack 153 and the second rack 154. In this way, the first rack 153 and the second rack 154 can synchronously slide toward or away from each other via the synchronization gear 155, so that the first arc-shaped rotation block 1111 meshed with the first rack 153 and the second arc-shaped rotation block 1151 meshed with the second rack 154 can synchronously rotate toward or away from each other.

In some embodiments, a first opening groove 126 and a second opening groove 127 may be disposed on a side that is of the base 12 and that is away from the support surface 1*b* (refer to the base shown in FIG. 5), and the first opening groove 126 may be in communication with the first arc-shaped groove 121, and the second opening groove 127 may be in communication with the second arc-shaped groove 123. In a specific implementation, the first gear tooth 151 may be disposed in an area in which the first arc-shaped rotation block 1111 is exposed to the first opening groove 126, and the first rack 153 is slidably disposed in the first opening groove 126, so that the first gear tooth 151 is meshed with the first rack 153. Similarly, the second gear tooth 152 may be disposed in an area in which the second arc-shaped rotation block 1151 is exposed to the second opening groove 127, and the second rack 154 is slidably disposed in the second opening groove 127, so that the second gear tooth 152 is meshed with the second rack 154.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

The invention claimed is:

1. A hinge mechanism comprising:
- a base comprising:
  - a first side;
  - a second side;
  - a support surface comprising:
    - a third side; and
    - a fourth side;
  - a first sink step disposed on the third side; and
  - a second sink step disposed on the fourth side; and
- a main shaft component comprising:
  - a first rotation component disposed on the first side and comprising:
    - a first pin shaft;
    - a first support arm rotatably coupled to the base;
    - a first rotation plate comprising:
      - a fifth side rotatably coupled to the first support arm via the first pin shaft; and
      - a sixth side; and
    - a first torsion spring sleeved on the first pin shaft and comprising:
      - a first torsion arm fastened to the first support arm; and a second torsion arm abutting against the fifth side; and a second rotation component disposed on the second side and comprising:

a second pin shaft;

a second support arm rotatably coupled to base;

second rotation plate comprising:

a seventh side rotatably coupled to the second support arm via the second pin shaft; and an eighth side; and a second torsion spring sleeved on the second pin shaft and comprising:

a third torsion arm fastened to the second support arm; and a fourth torsion arm abutting against the seventh side, wherein when the hinge mechanism is switched from an unfolded state to a folded state, the first support arm and the second support arm are configured to rotate toward each other, the first torsion spring is configured to drive the first rotation plate to rotate relative to the first support arm to make the sixth side rotate from a first state of forming a lap joint with the first sink step to a second state of being attached to the first support arm, and the second torsion spring is configured to drive the second rotation plate to rotate relative to the second support arm to make the eighth side rotate from a third state of forming a lap joint with the second sink step to a fourth state of being attached to the second support arm, and wherein when the hinge mechanism is switched from the folded state to the unfolded state, the first support arm and the second support arm are configured to rotate away from each other, the sixth side is configured to rotate from the second state to the first state and to drive the first torsion spring to reset, and the eighth side is configured to rotate from the fourth state to the third state and to drive the second torsion spring to reset.

2. The hinge mechanism of claim 1, wherein the first rotation plate further comprises a ninth side that is disposed away from the first sink step and that comprises a first surface, wherein the second rotation plate further comprises a tenth side that is disposed away from the second sink step and that comprises a second surface, and wherein when the hinge mechanism is in the unfolded state, the first surface is aligned with the support surface and the second surface is aligned with the support surface.

3. The hinge mechanism of claim 1, wherein the first support arm further comprises a ninth side facing the first rotation plate, wherein the second support arm further comprises a tenth side facing the second rotation plate, wherein the hinge mechanism further comprises:

a first groove disposed on the ninth side; and a second groove disposed on the tenth side, and wherein when the hinge mechanism is in the folded state, the first rotation plate is disposed in the first groove, and the second rotation plate is disposed in the second groove.

4. The hinge mechanism of claim 1, wherein the first support arm further comprises a ninth side, wherein the second support arm further comprises a tenth side, and wherein the hinge mechanism further comprises:

a first convex lug disposed on the fifth side and the ninth side;

a first through hole disposed on the first convex lug, wherein the first pin shaft is rotatably disposed in the first through hole;

a second convex lug disposed on the first-seventh side the tenth side; and a second through hole disposed on the second convex lug, wherein the second pin shaft is rotatably disposed in the second through hole.

5. The hinge mechanism of claim 4, further comprising:

a first limiting groove disposed on the first convex lug and comprising a first opening disposed away from the sixth side, wherein the second torsion arm is disposed in the first limiting groove; and a second limiting groove disposed on the second convex lug and comprising a second opening disposed away from the eighth side, wherein the fourth torsion arm is disposed in the second limiting groove.

6. The hinge mechanism of claim 4, wherein the first convex lug comprises:

a first surface that is disposed away from the first support arm; and a second surface, wherein the second convex lug comprises:

a third surface that is disposed away from the second support arm; and a fourth surface, wherein the hinge mechanism further comprises:

a first stopper disposed on the first surface and comprising a first extension rib, wherein the first extension rib and the first convex lug are spaced apart from each other, and wherein a first projection of the first extension rib on the second surface covers a first part of the first through hole; and a second stopper disposed on the second surface and comprising a second extension rib, wherein the second extension rib and the second convex lug are spaced apart from each other, and wherein a second projection of the second extension rib on the fourth surface covers a second part of the second through hole; and, wherein the first pin shaft comprises a first end part disposed between the first convex lug and the first extension rib, and wherein the second pin shaft comprises a second end part disposed between the second convex lug and the second extension rib.

7. The hinge mechanism of claim 1, further comprising:

a first arc-shaped groove disposed on the base; and a second arc-shaped groove disposed on the base, wherein the first support arm further comprises a first arc-shaped rotation block is rotatably disposed in the first arc-shaped groove, and wherein the second support arm comprises a second arc-shaped rotation block rotatably disposed in the second arc-shaped groove.

8. The hinge mechanism of claim 7, wherein the first arc-shaped groove and the second arc-shaped groove are staggered in a length direction of the hinge mechanism.

9. The hinge mechanism of claim 7, wherein the first arc-shaped groove comprises a first arc-shaped sub-groove and a second arc-shaped sub-groove that are spaced apart from each other in a length direction of the hinge mechanism, and wherein the first arc-shaped rotation block comprises:

a first rotation sub-block slidably disposed in the first arc-shaped sub-groove; and a second rotation sub-block that is spaced with the first rotation sub-block in the length direction and that is slidably disposed in the second arc-shaped sub-groove, wherein the second arc-shaped groove comprises a third arc-shaped sub-groove and a fourth arc-shaped sub-groove that are spaced apart from each other in the length direction, wherein the second arc-shaped rotation block comprises:

a third rotation sub-block slidably disposed in the third arc-shaped sub-groove; and a fourth rotation sub-block that is spaced with the third rotation sub-block in the length direction and that is slidably disposed in the fourth arc-shaped sub-groove;

wherein the first sink step is disposed between the first arc-shaped sub-groove and the second arc-shaped sub-groove, and wherein the second sink step is disposed between the third arc-shaped sub-groove and the fourth arc-shaped sub-groove.

10. The hinge mechanism of claim 7, wherein the first support arm further comprises a first fastening block coupled to the first arc-shaped rotation block and comprising a first end surface, wherein the second support arm further comprises a second fastening block coupled to the second arc-shaped rotation block and comprising a second end surface, wherein the first end surface is disposed opposite to the second end surface when the hinge mechanism is in the folded state, and wherein the first end surface and the second end surface are separately aligned with the support surface when the hinge mechanism is in the unfolded state.

11. The hinge mechanism of claim 7, wherein the first arc-shaped rotation block in a length direction of the hinge mechanism comprises an end comprising a first cam surface, and wherein the hinge mechanism further comprises:

a first mounting hole extended in the length direction, disposed on the base, and in communication with the first arc-shaped groove; and a first damping component mounted in the first mounting hole and comprising:

a first stop block fastened to the first mounting hole and comprising a ninth side facing the first arc-shaped groove;

a first cam disposed on the ninth side and comprising a tenth side, wherein the tenth side comprises a second cam surface abutting against the first cam surface; and a first elastic member between the first stop block and the first cam, wherein the tenth side is disposed away from the first elastic member.

12. The hinge mechanism of claim 7, wherein the first arc-shaped rotation block comprises a first outer arc wall, wherein the second arc-shaped rotation block comprises a second outer arc wall, and wherein the hinge mechanism further comprises a synchronization component comprising:

a first gear tooth disposed on the first outer arc wall; and a second gear tooth disposed on the second outer arc wall and connected to the first gear tooth.

13. The hinge mechanism of claim 12, wherein the synchronization component further comprises:

a first rack slidably disposed on the base and meshed with the first gear tooth;

a second rack slidably disposed on the base and meshed with the second gear tooth, wherein the first rack and the second rack are spaced apart from each other in a length direction of the hinge mechanism; and a synchronization gear is disposed between the first rack and the second rack and separately meshed with the first rack and the second rack.

14. The hinge mechanism of claim 13, wherein the base further comprises a ninth side disposed away from the support surface, and wherein the hinge mechanism further comprises:

a first opening groove disposed in the ninth side and in communication with the first arc-shaped groove, wherein the first gear tooth is disposed in a first area in which the first arc-shaped rotation block is exposed to the first opening groove, and wherein the first rack is slidably disposed in the first opening groove; and a second opening groove disposed in the ninth side and in communication with the second arc-shaped groove, wherein the second gear tooth is disposed in a second area in which the second arc-shaped rotation block is exposed to the second opening groove, and wherein the second rack is slidably disposed in the second opening groove.

15. The hinge mechanism of claim 1, wherein the base further comprises a ninth side disposed away from the support surface, and wherein the hinge mechanism further comprises an end cover disposed on the ninth side.

16. An electronic device comprising:

a hinge mechanism comprising:

a base comprising:

a first side;

a second side;

a support surface comprising:

a third side; and a fourth side;

a first sink step disposed on the third side; and a second sink step disposed on the fourth side; and a main shaft component comprising:

a first rotation component disposed on the first side and comprising:

a first pin shaft;

a first support arm rotatably coupled to the base;

a first rotation plate comprising:

a fifth side rotatably coupled to the first support arm via the first pin shaft; and a sixth side;

a first torsion spring sleeved on the first pin shaft and comprising:

a first torsion arm fastened to the first support arm; and a second torsion arm abutting against the fifth side; and a second rotation component disposed on the second side and comprising:

a second pin shaft;

a second support arm rotatably coupled to the base;

second rotation plate comprising:

a seventh side rotatably coupled to the second support arm via the second pin shaft; and an eighth side; and a second torsion spring sleeved on the second pin shaft and comprising:

a third torsion arm fastened to the second support arm; and a fourth torsion arm abutting against the seventh side, wherein when the hinge mechanism is switched from an unfolded state to a folded state, the first support arm and the second support arm are configured to rotate toward each other, the first torsion spring is configured to drive the first rotation plate to rotate relative to the first support arm to make the sixth side rotate from a first state of forming a lap joint with the first sink step to a second state of being attached to the first support arm, and the second torsion spring is configured to drive the second rotation plate to rotate relative to the second support arm to make the eighth side rotate from a third state of forming a lap joint with the second sink step to a fourth state of being attached to the second support arm, and wherein when the hinge mechanism is switched from the folded state to the unfolded state, the first support arm and the second support arm are configured to rotate away from each other, the sixth side is configured to rotate from the second state to the first state of and to drive the first torsion spring to reset, and the eighth side is configured to rotate from the fourth state to the third state and to drive the second torsion spring to reset;

a first housing fastened to the first support arm;

a second housing fastened to the second support arm, wherein the first housing and the second housing are separately disposed on two sides of the hinge mechanism; and a flexible display fastened to the first housing and the second housing and configured to continuously cover the first housing, the second housing, and the hinge mechanism.

17. The electronic device of claim 16, wherein the first rotation plate further comprises a ninth side that is disposed away from the first sink step and that comprises a first surface, wherein the second rotation plate further comprises a tenth side that is disposed away from the second sink step and that comprises a second surface, and wherein when the hinge mechanism is in the unfolded state, the first surface is aligned with the support surface, and the second surface is aligned with the support surface.

18. The electronic device of claim 16, wherein the first support arm further comprises a ninth side facing the first rotation plate, wherein the second support arm further comprises a tenth side facing the second rotation plate, wherein the hinge mechanism further comprises:

a first groove disposed on the ninth side; and a second groove disposed on the tenth side, and wherein when the hinge mechanism is in the folded state, the first rotation plate is disposed in the first groove, and the second rotation plate is disposed in the second groove.

19. The electronic device of claim 16, wherein the first support arm further comprises a ninth side, wherein the second support arm further comprises a tenth side, and wherein the hinge mechanism further comprises:

a first convex lug disposed on the fifth side and the ninth side;

a first through hole disposed on the first convex lug, wherein the first pin shaft is rotatably disposed in the first through hole;

a second convex lug disposed on the first seventh side and the tenth side; and a second through hole disposed on the second convex lug, wherein the second pin shaft is rotatably disposed in the second through hole.

20. The electronic device of claim 19, further comprising:

a first limiting groove disposed on the first convex lug and comprising a first opening disposed away from the sixth side, wherein the second torsion arm is disposed in the first limiting groove; and a second limiting groove disposed on the second convex lug and comprising a second opening disposed away from the eighth side, wherein the fourth torsion arm is disposed in the second limiting groove.

* * * * *